US008050898B2

(12) United States Patent  (10) Patent No.: US 8,050,898 B2
Hansen  (45) Date of Patent: Nov. 1, 2011

(54) METHOD, PROGRAM PRODUCT AND APPARATUS FOR PREDICTING LINE WIDTH ROUGHNESS AND RESIST PATTERN FAILURE AND THE USE THEREOF IN A LITHOGRAPHY SIMULATION PROCESS

(75) Inventor: Steve Hansen, Phoenix, AZ (US)

(73) Assignee: ASML Masktools B.V., Veldhoven (NL)

( * ) Notice: Subject to any disclaimer, the term of this patent is extended or adjusted under 35 U.S.C. 154(b) by 664 days.

(21) Appl. No.: 11/979,838

(22) Filed: Nov. 8, 2007

(65) Prior Publication Data

US 2008/0183446 A1  Jul. 31, 2008

Related U.S. Application Data

(60) Provisional application No. 60/857,495, filed on Nov. 8, 2006.

(51) Int. Cl.
*G06G 7/48* (2006.01)
(52) U.S. Cl. ............................................................. 703/6
(58) Field of Classification Search ....................... 703/6
See application file for complete search history.

(56) References Cited

U.S. PATENT DOCUMENTS

| 5,229,872 | A | * | 7/1993 | Mumula ............................ 349/2 |
| 5,296,891 | A | * | 3/1994 | Vogt et al. ....................... 355/67 |
| 5,523,193 | A | * | 6/1996 | Nelson ........................... 430/311 |
| 5,876,885 | A |   | 3/1999 | Mimotogi et al. .............. 430/30 |
| 5,969,441 | A | * | 10/1999 | Loopstra et al. ................ 355/53 |
| 6,046,792 | A | * | 4/2000 | Van Der Werf et al. ... 310/12.06 |
| 7,521,405 | B2 |  | 4/2009 | Zhang et al. ................... 510/175 |
| 7,600,213 | B2 |  | 10/2009 | Nojima et al. ................... 716/21 |
| 2007/0032896 | A1 | * | 2/2007 | Ye et al. .......................... 700/108 |
| 2008/0004852 | A1 |  | 1/2008 | Satake et al. ..................... 703/13 |

FOREIGN PATENT DOCUMENTS

| JP | 09-043828 | 2/1997 |
| JP | 2002-221787 | 8/2002 |
| JP | 2003-241386 | 8/2003 |
| JP | 2003-302214 | 10/2003 |
| JP | 2005-221801 | 8/2005 |
| JP | 2005-292827 | 10/2005 |

(Continued)

OTHER PUBLICATIONS

V. Constantoudis et al., "Line edge roughness and critical dimension variation: Fractal characterization and comparison using model functions", 2004, Journal of Vaccuum Science and Technology B vol. 22, issue 4, pp. 1974-1981.*

(Continued)

*Primary Examiner* — Paul Rodriguez
*Assistant Examiner* — Russ Guill
(74) *Attorney, Agent, or Firm* — Pillsbury Winthrop Shaw Pittman LLP

(57) ABSTRACT

A method of generating a model for simulating the imaging performance of an optical imaging system. The method includes the steps of defining the optical imaging system and a process to be utilized by the optical imaging system; defining a first model representing the imaging performance of the optical imaging system and the process, and calibrating the model, where the first model generates values corresponding to a latent image slope. The method further includes the step of defining a second model for estimating a line width roughness of a feature to be imaged, where the second model utilizes the latent image slope values to estimate the line width roughness.

9 Claims, 26 Drawing Sheets

FOREIGN PATENT DOCUMENTS

| | | |
|---|---|---|
| JP | 2005-302800 | 10/2005 |
| JP | 2006-154245 | 6/2006 |
| JP | 2007-324479 | 12/2007 |

OTHER PUBLICATIONS

Schmid et al. "Spatial distribution of reaction products in positive tone chemically amplified resists", J. Vac. Sci. Technology, B 20(1), Jan./Feb. 2002, American Vacuum Society, pp. 185-190.

Pawloski et al., "Characterization of line edge roughness in photoresist using an image fading technique", Advances in Resist Technology and Processing XXI, Proceedings of SPIE vol. 5376, pp. 414-425, 2004.

Michaelson et al., "The Effects of Chemical Gradients and Photoresist Composition on Lithographically Generated Line Edge Roughness", Advances in Resist Technology and Processing XXII, Proceedings of SPIE, vol. 5753, pp. 368-379, 2005.

Biafore, John J. et al., "Mechanistic Simulation of Line-Edge Roughness", *Proc. Of SPIE*, vol. 6519, (2007), pp. 1-17.*

Gallatin, Gregg M., "Resist Blur and Line Edge Roughness", *Proc. SPIE*, vol. 5754, (2005), pp. 38-52.*

Pawloski, Adam R. et al., "Gradients in Chemically Amplified Resist Define Lithographically Generated Line Edge Roughness", Proc. ARCH Microelectron. Mat. Interface Conf., 41st Interface Symposium Conf., Tempe, AZ (2004), pp. 1-10.*

Sanchez, Martha I. et al., "Aerial Image Contrast using Interferometric Lithography: Effect on Line-Edge Roughness", *SPIE*, vol. 3678, (Mar. 1999), pp. 160-171.*

* cited by examiner

SIM. W/ NO COLLAPSE
PREDICTS DOF~0.7u

SIMULATED PROCESS WINDOW,
INCLUDE LISLOPE MIN=14
CDMIN=32nm, $C_{CT}$=2

SIM. W/ COLLAPSE
DOF~0.52u

METHOD, PROGRAM PRODUCT AND APPARATUS FOR PREDICTING LINE WIDTH ROUGHNESS AND RESIST PATTERN FAILURE AND THE USE THEREOF IN A LITHOGRAPHY SIMULATION PROCESS

PRIORITY CLAIM

This application claims priority to Provisional Application Ser. No. 60/857,495, filed on Nov. 8, 2006, the contents of which are incorporated herein in its entirety.

TECHNICAL FIELD

This disclosure relates generally to lithographic simulation tools. More particularly, it relates to a method for modeling and/or predicting line width roughness and resist pattern failure in a lithography process and a method for utilizing the same in a lithographic simulation process.

BACKGROUND

Lithographic apparatus can be used, for example, in the manufacture of integrated circuits (ICs). In such a case, the mask may contain a circuit pattern corresponding to an individual layer of the IC, and this pattern can be imaged onto a target portion (e.g., comprising one or more dies) on a substrate (silicon wafer) that has been coated with a layer of radiation-sensitive material (resist). In general, a single wafer will contain a whole network of adjacent target portions that are successively irradiated via the projection system, one at a time. In one type of lithographic projection apparatus, each target portion is irradiated by exposing the entire mask pattern onto the target portion in one go; such an apparatus is commonly referred to as a wafer stepper. In an alternative apparatus, commonly referred to as a step-and-scan apparatus, each target portion is irradiated by progressively scanning the mask pattern under the projection beam in a given reference direction (the "scanning" direction) while synchronously scanning the substrate table parallel or anti-parallel to this direction. Since, in general, the projection system will have a magnification factor M (generally >1), the speed V at which the substrate table is scanned will be a factor M times that at which the mask table is scanned. More information with regard to lithographic devices as described herein can be gleaned, for example, from U.S. Pat. No. 6,046,792, incorporated herein by reference.

In a manufacturing process using a lithographic projection apparatus, a mask pattern is imaged onto a substrate that is at least partially covered by a layer of radiation-sensitive material (resist). Prior to this imaging step, the substrate may undergo various procedures, such as priming, resist coating and a soft bake. After exposure, the substrate may be subjected to other procedures, such as a post-exposure bake (PEB), development, a hard bake and measurement/inspection of the imaged features. This array of procedures is used as a basis to pattern an individual layer of a device, e.g., an IC. Such a patterned layer may then undergo various processes such as etching, ion-implantation (doping), metallization, oxidation, chemo-mechanical polishing, etc., all intended to finish off an individual layer. If several layers are required, then the whole procedure, or a variant thereof, will have to be repeated for each new layer. Eventually, an array of devices will be present on the substrate (wafer). These devices are then separated from one another by a technique such as dicing or sawing, whence the individual devices can be mounted on a carrier, connected to pins, etc.

For the sake of simplicity, the projection system may hereinafter be referred to as the "optics;" however, this term should be broadly interpreted as encompassing various types of projection systems, including refractive optics, reflective optics, and catadioptric systems, for example. The radiation system may also include components operating according to any of these design types for directing, shaping or controlling the projection beam of radiation, and such components may also be referred to below, collectively or singularly, as a "lens." Further, the lithographic apparatus may be of a type having two or more substrate tables (and/or two or more mask tables). In such "multiple stage" devices the additional tables may be used in parallel, or preparatory steps may be carried out on one or more tables while one or more other tables are being used for exposures. Twin stage lithographic apparatus are described, for example, in U.S. Pat. No. 5,969,441, incorporated herein by reference.

The photolithographic masks referred to above comprise geometric patterns corresponding to the circuit components to be integrated onto a silicon wafer. The patterns used to create such masks are generated utilizing CAD (computer-aided design) programs, this process often being referred to as EDA (electronic design automation). Most CAD programs follow a set of predetermined design rules in order to create functional masks. These rules are set by processing and design limitations. For example, design rules define the space tolerance between circuit devices (such as gates, capacitors, etc.) or interconnect lines, so as to ensure that the circuit devices or lines do not interact with one another in an undesirable way. A critical dimension of a circuit can be defined as the smallest width of a line or hole or the smallest space between two lines or two holes. Thus, the CD determines the overall size and density of the designed circuit.

As the required CDs continue to decrease, photolithographic simulation based on physical models has become an essential tool for understanding and optimizing the advanced photolithographic processes necessary for today's advanced circuit designs. An important aspect of such simulation processes is to utilize calibrated models which accurately describe the resist process (e.g., the image to be formed in the resist layer deposited on the substrate). This is especially true in the low-k1 regime where the printed images in photoresist depart significantly from the projected optical image. Reasons for this disparity are well understood and relate to diffusion of components in the photoresist and finite dissolution contrast. As such, without calibration of the photoresist model to match experimental data, the utility of photolithographic simulation processes are significantly reduced. A characteristic of a well calibrated model is that the critical dimensions (CD) of printed features are accurately predicted.

Recently though it has become clear that current simulation models may be insufficient as many low-k1 processes are limited not by details of the measured and predicted CDs, but by other considerations such as the roughness of the printed feature and whether it actually appears on the wafer or has suffered some type of pattern failure. Line width roughness (LWR), which is defined as the $3\sigma$ variation in the measured feature width, has received significant attention because as feature sizes and k1 simultaneously shrink, this width variation can be an appreciable fraction of the total CD budget, and device performance can be compromised as a result of LWR.

Currently, however, generally speaking LWR and pattern failure cannot be readily predicted by standard photolithographic simulation tools, and in fact, their prediction is typically not even addressed. Models for calculating microscopic roughness, specifically line width roughness (LWR) have appeared in the literature, but these known techniques are slow and complex and cannot be easily incorporated into the standard method of working with simulators, and therefore do not offer a practical solution.

Accordingly, there exists a need for a method for predicting both LWR and pattern failure that is both practical and efficient and which can be readily implemented into current photolithography simulation processes.

SUMMARY

In view of the foregoing deficiencies in the prior art imaging models, the present invention provides a method that for a given resist process allows for both LWR and pattern failure to be predicted by an empirical model, which uses image metrics available from a lithographic simulation program. The method is particularly useful because it allows the predictions of LWR and pattern failure to be directly output by standard lithographic simulation programs without any new or complex calculations.

More specifically, the present invention relates to a method of generating a model for simulating the imaging performance of an optical imaging system. The method includes the steps of defining the optical imaging system and a process to be utilized by the optical imaging system; defining a first model representing the imaging performance of the optical imaging system and the process, and calibrating the model, where the first model generates values corresponding to a latent image slope. Specifically, first the first model is calibrated in the typical manner so as to match the experimental critical dimensions (CDs). As an intermediate step in this process, values for the latent image slope are also generated. Then, the method further includes the step of defining a second model for estimating a line width roughness of a feature to be imaged, where the second model utilizes the latent image slope values to estimate the line width roughness.

In a second embodiment, the present invention relates to a method of predicting the occurrence of pattern failure. The method of this embodiment includes the steps of defining said optical imaging system and a process to be utilized by the optical imaging system; defining a first model representing the imaging performance of the optical imaging system and the process, and calibrating said model, where the first model generates, for example, CDs to match experiment and latent image slope values as intermediates. The method further includes the step of defining a second model for estimating a pattern failure regarding a feature to be imaged, where the second model utilizes the latent image slope values to define parameters which are utilized to predict when pattern failure of a given feature will occur.

As explained in more detail below, the method of the present invention provides significant advantages over the prior art. Most importantly, the present invention provides a simulation model which can accurately estimate LWR and predict pattern failure, and which is readily implemented utilizing existing simulation models. As a result, a more accurate imaging model and simulation result is produced, which benefits all applications utilizing such simulation processes. For example, including pattern failure and LWR information into the analysis of pattern printing allows an IC manufacturer to better identify areas where the device might fail and allow the manufacturer to improve the mask or scanner conditions to avoid costly delays.

Although specific reference may be made in this text to the use of the invention in the manufacture of ICs, it should be explicitly understood that the invention has many other possible applications. For example, it may be employed in the manufacture of integrated optical systems, guidance and detection patterns for magnetic domain memories, liquid-crystal display panels, thin-film magnetic heads, etc. The skilled artisan will appreciate that, in the context of such alternative applications, any use of the terms "reticle," "wafer" or "die" in this text should be considered as being replaced by the more general terms "mask," "substrate" and "target portion," respectively. Although specific reference may be made in this text to the use of the invention in the manufacture of ICs, it should be explicitly understood that the invention has many other possible applications. For example, it may be employed in conjunction with the manufacture of integrated optical systems, guidance and detection patterns for magnetic domain memories, liquid-crystal display panels, thin-film magnetic heads, etc. The skilled artisan will appreciate that, in the context of such alternative applications, any use of the terms "reticle", "wafer" or "die" in this text should be considered as being replaced by the more general terms "mask", "substrate" and "target portion", respectively.

In the present document, the terms "radiation" and "beam" are used to encompass all types of electromagnetic radiation, including ultraviolet radiation (e.g. with a wavelength of 365, 248, 193, 157 or 126 nm) and EUV (extreme ultra-violet radiation, e.g. having a wavelength in the range 5-20 nm).

The term mask as employed in this text may be broadly interpreted as referring to generic patterning means that can be used to endow an incoming radiation beam with a patterned cross-section, corresponding to a pattern that is to be created in a target portion of the substrate; the term "light valve" can also be used in this context. Besides the classic mask (transmissive or reflective; binary, phase-shifting, hybrid, etc.), examples of other such patterning means include:

a programmable mirror array. An example of such a device is a matrix-addressable surface having a viscoelastic control layer and a reflective surface. The basic principle behind such an apparatus is that (for example) addressed areas of the reflective surface reflect incident light as diffracted light, whereas unaddressed areas reflect incident light as undiffracted light. Using an appropriate filter, the said undiffracted light can be filtered out of the reflected beam, leaving only the diffracted light behind; in this manner, the beam becomes patterned according to the addressing pattern of the matrix-addressable surface. The required matrix addressing can be performed using suitable electronic means. More information on such mirror arrays can be gleaned, for example, from United States Patents U.S. Pat. Nos. 5,296,891 and 5,523,193, which are incorporated herein by reference.

a programmable LCD array. An example of such a construction is given in United States Patent U.S. Pat. No. 5,229,872, which is incorporated herein by reference.

The invention itself, together with further objects and advantages, can be better understood by reference to the following detailed description and the accompanying drawings.

DETAILED DESCRIPTION

Figure 1:
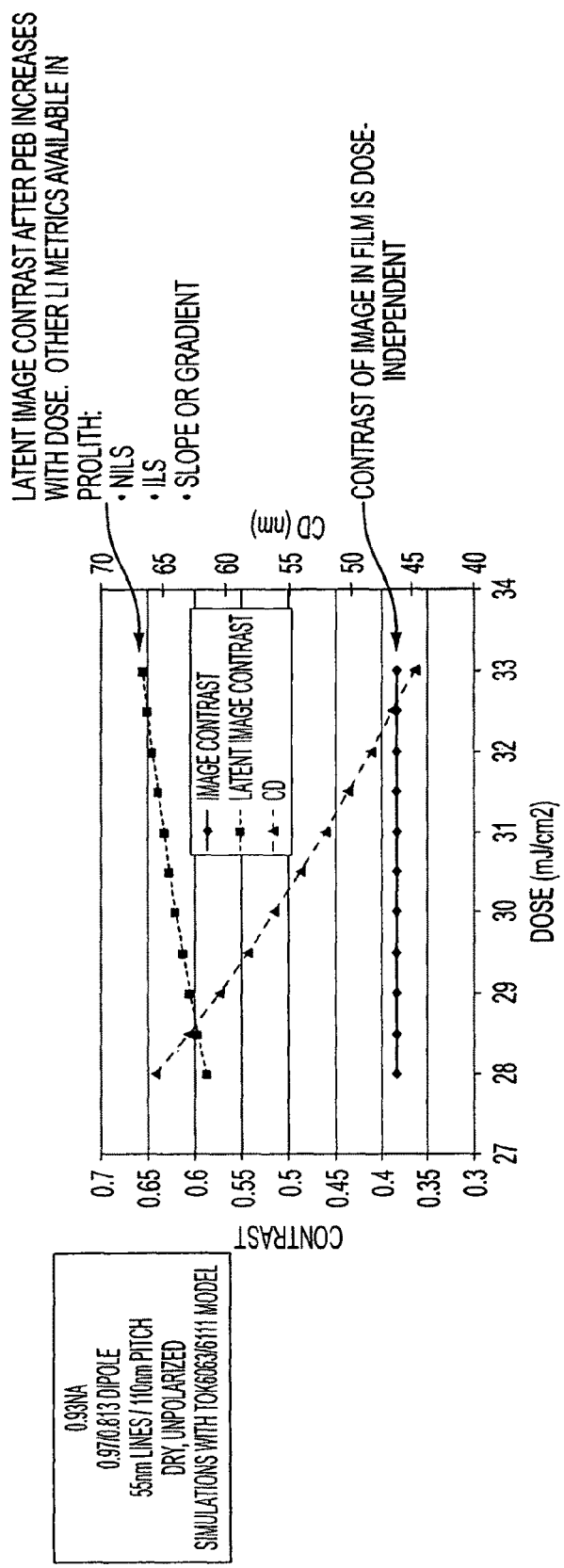
FIG. 1 illustrates how image contrast and latent image contrast vary with dose.

In accordance with the present invention, and as explained in further detail below, the preferred image metric used for modeling and/or predicting both LWR and pattern failure is the slope of the latent image ($LI_{slope}$) in the resist film at the edge of the developed resist feature. $LI_{slope}$ is a direct description of the quality of the image in the resist prior to development and it is strongly related to the quality of the developed resist image. The $LI_{slope}$ quantity/value is readily available from the typical simulator (such as those offered by ASML) using a standard calibrated model because for any dose, focus, illumination, mask, NA, polarization, etc., condition the simulator returns a CD prediction, which defines the feature edge, and retains in an intermediate step, the latent image slope ($LI_{slope}$) corresponding with the given position and imaging conditions. It is noted that other similar metrics may also provide useful predictors for LWR and pattern failure, for example, but not limited to, latent image NILS (normalized image log slope), latent image ILS (image log slope), and the simpler, analogous optical image metrics. As noted, LWR is dependent on image contrast (or NILS) and more precisely the image slope at the feature edge.

It is noted that there are different mathematical formulae that can be selected to relate the $LI_{slope}$ to experimental observations (i.e., actual imaging results) of LWR and pattern failure. The following formula have been found to hold quite well over an appreciable range. More specifically, the formula utilized in the exemplary embodiments disclosed herein are:

$$LWR = a \cdot (LI_{slope})^b + c,$$

where a, b, and c are empirical constants obtained by fitting the constants to actual experimental data such that the LWR numbers produced by the formula match the experimental/actual LWR results with some predefined error criteria.

With regard to predicting pattern failure, it is first noted that pattern failure can occur in at least two different instances. The first is when the aspect ratio of the feature to be imaged becomes to high. In such instances, the feature may literally fall over, for example, due to capillary forces from adjacent features during the develop/rinse process. The second is when the features to be imaged are too close together and start to merge (this is referred to as "scumming"). This sort of pattern failure may be related to excessive LWR and a small spatial separation leading to "bridging" between adjacent lines.

For pattern failure predictions, two different formulas/models have been developed, a three parameter model (which is intended to detect failures due to features falling over), and a five parameter model (which is intended to detect failures due to features falling over and due to scumming).

With regard to the three parameter model, for a given (i.e., fixed) resist process, the line feature is good (i.e. has a CD as predicted by lithographic simulator, and the feature is actually measurable on the wafer), if:

1. $CD > CD_{min}$
2. $LI_{slope} > LI_{slopemin}$
3. $(CD - CD_{min}) \cdot (LI_{slope} - LI_{slope\ min}) > C_{ct} \cdot CD_{min}$ (3-parameter model)

The three fitting constants of the three parameter model are $CD_{min}$, $LI_{slopemin}$, and $C_{ct}$. The physical interpretation of these parameters are as follows: 1) if the CD is too small ($<CD_{min}$) the feature will fall over and be washed off the wafer in the develop step, 2) if the chemical contrast is too low ($LI_{slopemin}$), the feature will not cleanly develop, even though, the mathematics of the simulator predict it will, and 3) when near the critical CD or the minimum LIslope there is an interaction, or cross-term between the two and the pattern actually fails even though both individual criteria are OK; Cct*CDmin is the coefficient for this cross-term. Similar to determining the constants for the LWR model, the foregoing parameters, CDmin, LIslopemin, and Cct, are obtained by determining the values of these constants at which the criteria predicting pattern failure actually match the experimental data.

For the 5-parameter model, the pattern is good if:
1. $CD > CD_{min}$
2. $LI_{Slope} > LI_{Slope\ min}$ (if $CD_{line} > CD_{space}$)
3. $(CD - CD_{min}) \cdot (LI_{Slope} - LI_{slope\ min}) > C_{ct} \cdot CD_{min}$
4. $pitch - CD > Space_{min}$
5. $LI_{slope} > LI_{slope\ min2}$ (if $CD_{space} > CD_{line}$) (5-parameter model)

The two additional fitting constants are Space$_{min}$ and LI$_{slopemin2}$ where the model now also detects pattern failures associated with spaces closing (i.e., scumming) not just lines falling over. This is particularly useful for dense features where the spaces and lines are comparable in size and pattern failure can occur either from lines falling over or spaces prematurely closing up.

A more detailed explanation of how the foregoing models predict both LWR and pattern failure is now provided. FIG. 1 illustrates, for a typical modern imaging problem, how image contrast and latent image contrast vary with dose. As further explained below, LWR also varies with dose. As such, FIG. 1 indicates that latent image metrics are preferable to image metrics in predicting LWR.

Figure 2A:
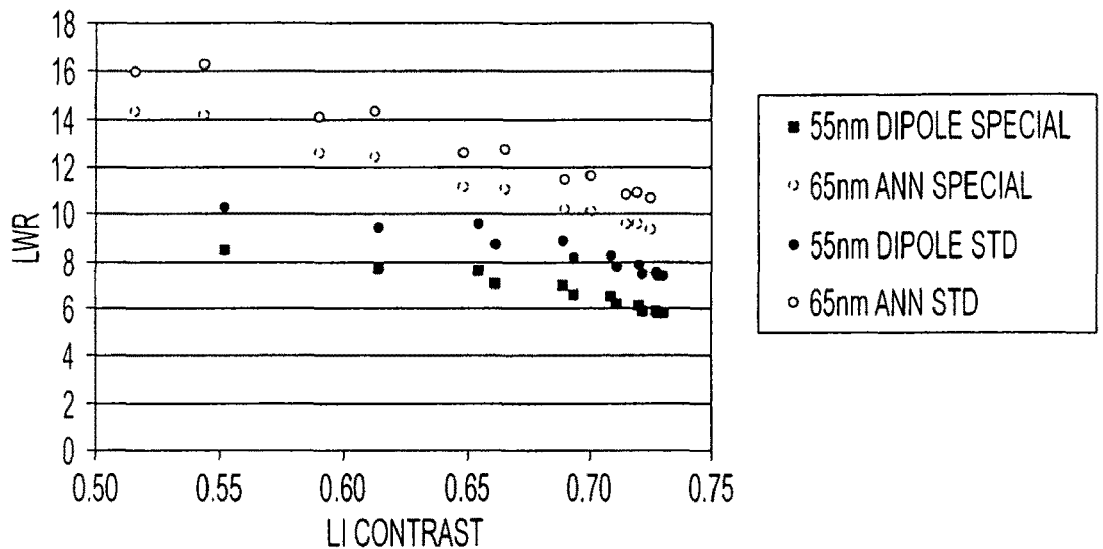
FIGS. 2a and 2b illustrate resulting latent image slope values associated with experimental results for two different resist processes.
Figure 2B:
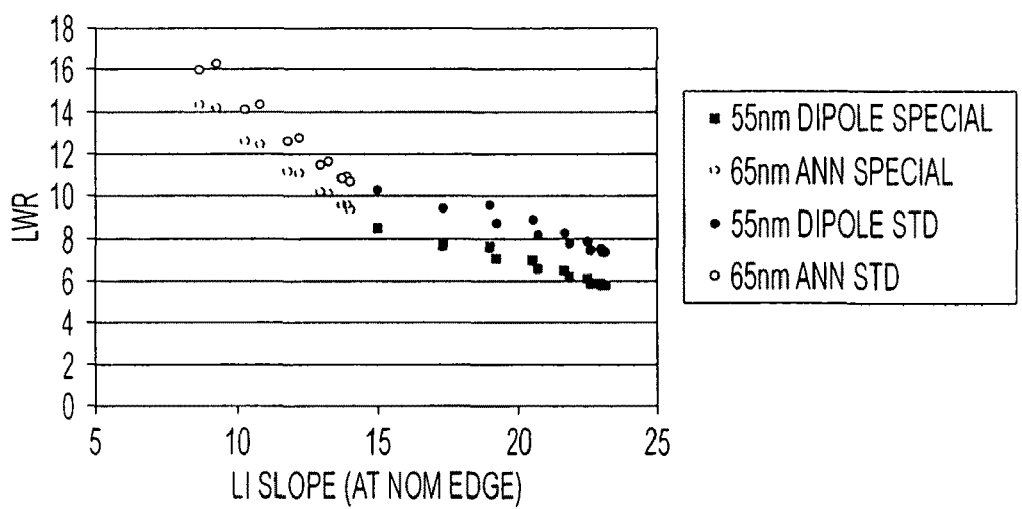

FIGS. 2a and 2b illustrates experimental results for two different resist processes: 1) a "standard" process and 2) a lower LWR process referred to as "special", with two different imaging problems: 1) 55 nm 1:1 lines with dipole illumination, and 2) 65 nm 1:1 lines with annular illumination, both using 193 nm light and a 0.93 NA lens. FIG. 2a plots the measured LWR values vs. the latent image contrast calculated using a calibrated model for each data point. Though for each condition (resist process and feature type/illumination) the plots are monotonic, there are four distinct curves. In contrast, FIG. 2b, which plots LWR vs. the latent image slope taken at the developed feature edge, separates into two curves, one for each resist process. As such, FIG. 2b indicates that LIslope at the feature edge is a superior predictor for LWR associated with a particular resist process than is LIcontrast. It is also shown that the standard process consistently gives LWR 2 nm higher than the special process.

Figure 3:
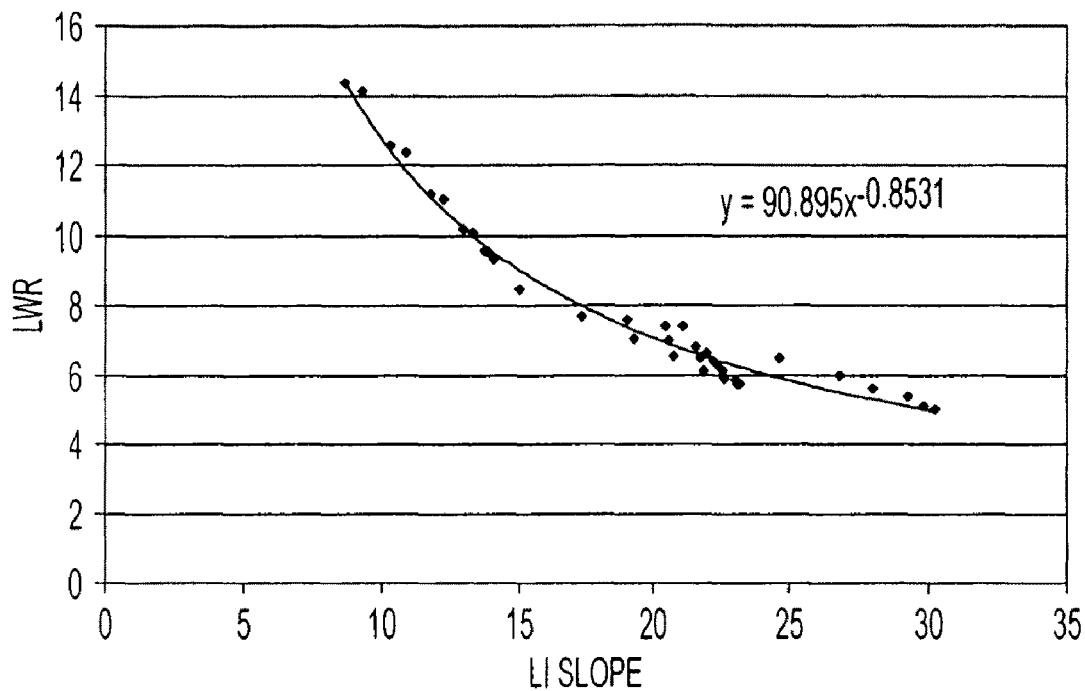
FIG. 3 illustrates data for the special process as mentioned in FIGS. 2a and 2b, and a curve produced by the LWR model which results from fitting the model parameters to the experimental data.

FIG. 3 illustrates data for the special process as mentioned in FIGS. 2a and 2b but also combines data taken at 1.2 NA for 42 nm 1:1 lines and 45 nm 1:1 lines produced with dipole illumination. A minor model adjustment was performed to also match the experimental dose latitude measurements, and the result is smooth monotonic behavior, which is fitted to the power series equation for predicting LWR set forth above. As such, it is clear that for other imaging problems with this resist process, the LWR can be sufficiently predicted by calculating the LIslope at the feature edge and using the foregoing equation having the constants fitted to the given resist process. In the given example, the equation becomes:

$$LWR = 90.9 \cdot (LI_{slope})^{-0.85}$$

A further check of the utility of this prediction is shown in Table 1 where the model is applied including a 2 nm offset because the standard process is used. Referring to Table 1, data for two different feature types (55 nm 1:1 and 60 nm 1:1) is compared at best focus and dose, both with and without polarized illumination. The predictions are reasonably close to the experimental values, and illustrates that polarization gives better LWR and a better latent image.

Figure 4:
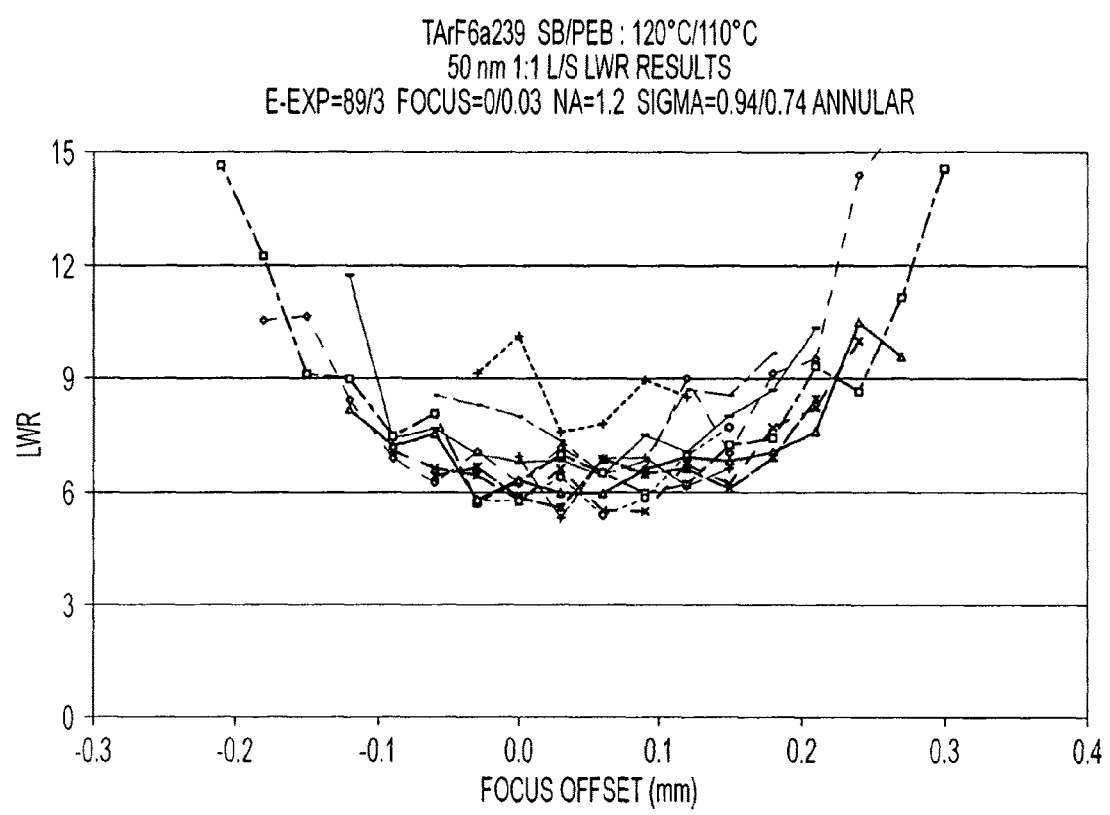
FIG. 4 shows experimental measurement of LWR for 50 nm 1:1 lines imaged with 1.2NA and 0.94/0.74 annular illumination through dose and focus.
Figure 5A:
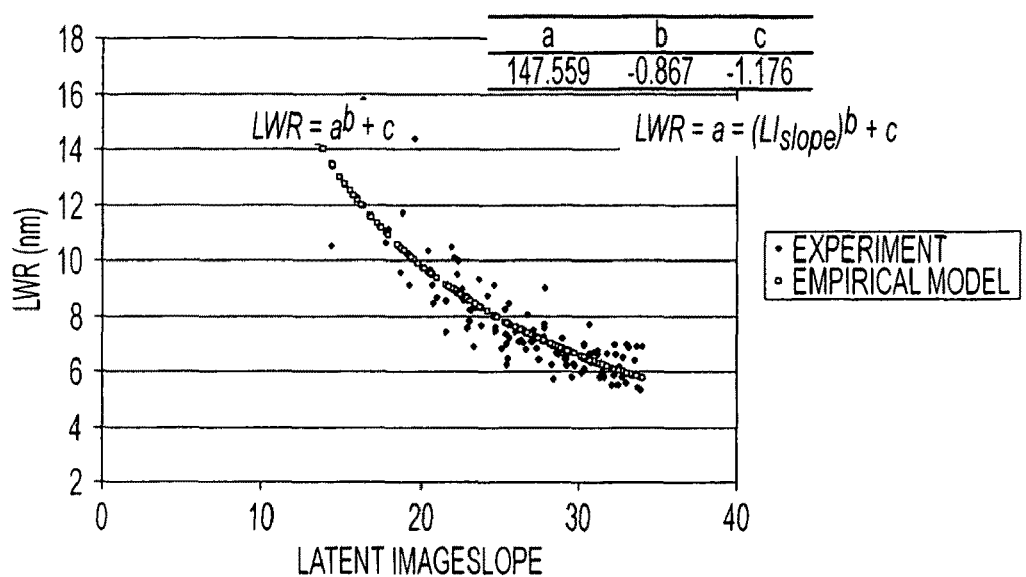
FIG. 5a shows a fit of the LIslope values obtained from the resist model to the LWR measurements using the empirical 3-parameter LWR equation.
Figure 5B:
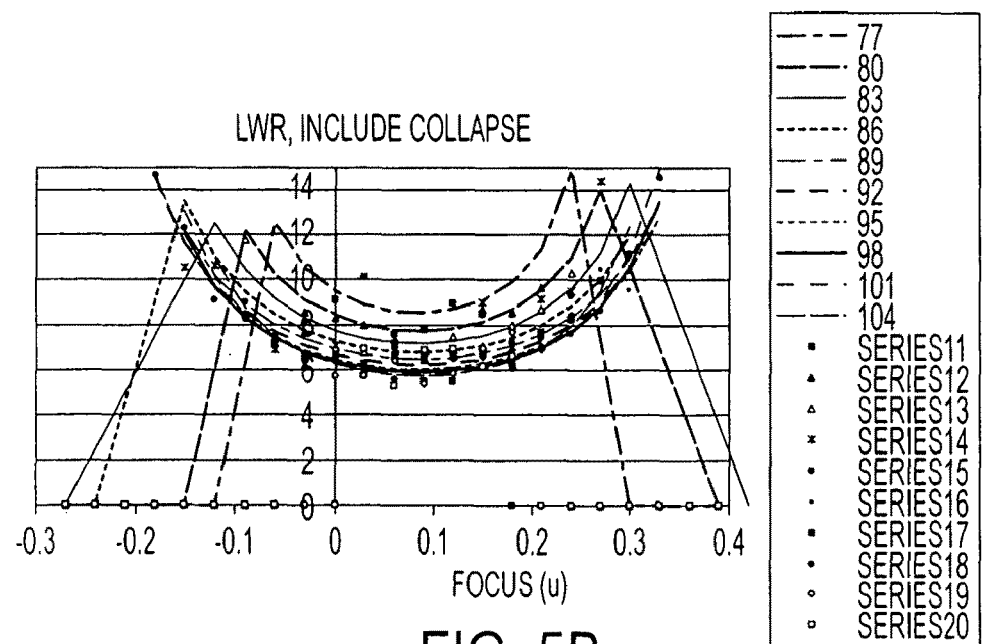
FIG. 5b illustrates an overlay of the LWR predictions and measurements through dose and focus.

A further indication of the sufficiency of the model is shown in FIG. 4 and FIGS. 5a and 5b. FIG. 4 shows experimental measurement of LWR for 50 nm 1:1 lines imaged with 1.2 NA and 0.94/0.74 annular illumination through dose and focus. It is shown that LWR increases as the image is defocused and with underexposure. FIG. 5a shows a smooth curve resulting from the three indicated coefficients and the modeled LIslope values, obtained from the resist model, overlaid on the experimental LWR measurements. It is shown that the model substantially reproduces the expected data, though clearly there is some noise in the experimental data, typical of LWR measurements. FIG. 5b overlays the LWR predictions and measurements through dose and focus. Again, the agreement is satisfactory, further validating the LWR model of the present embodiment.

Figure 6C:
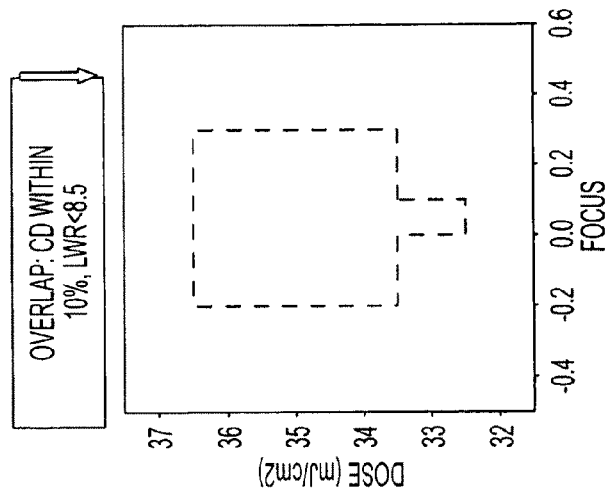
FIGS. 6(a)-6(f) illustrate an example of the how the LWR model can be utilized in a standard lithographic simulation process.
Figure 6B:
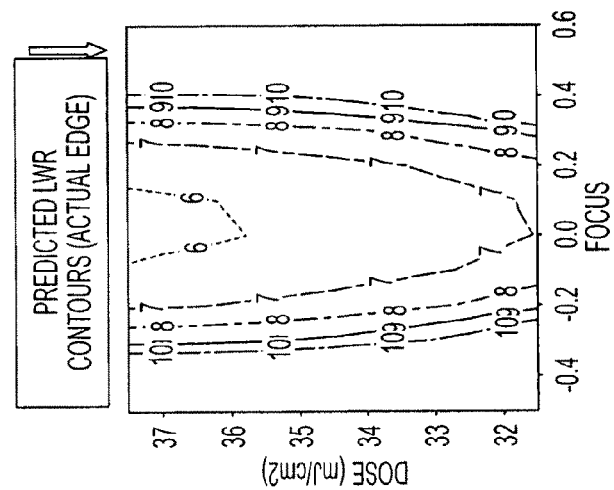
Figure 6A:
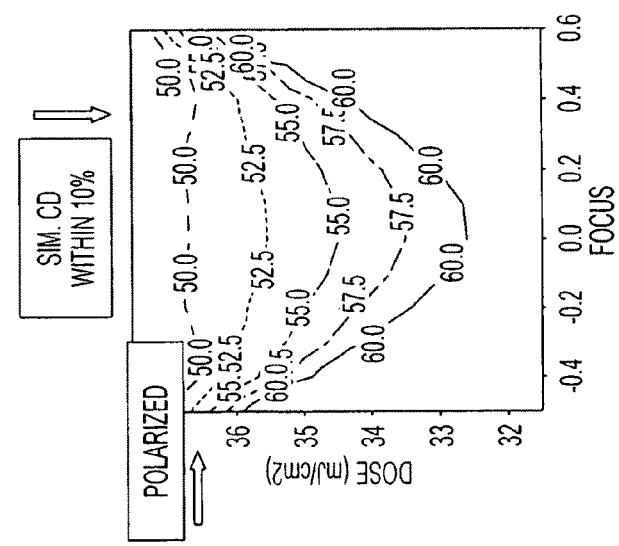
Figure 6F:
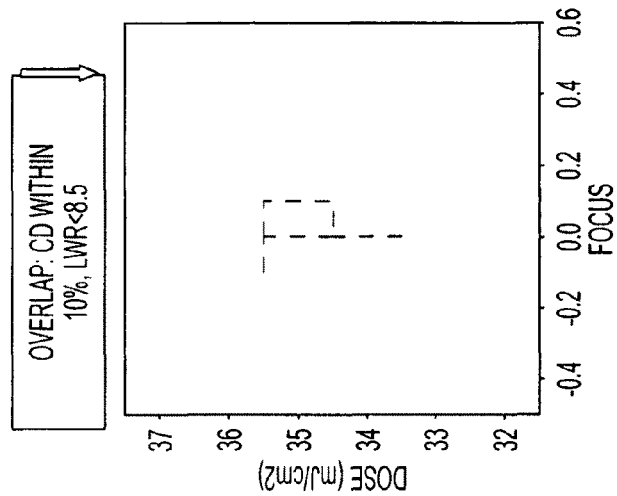
Figure 6E:
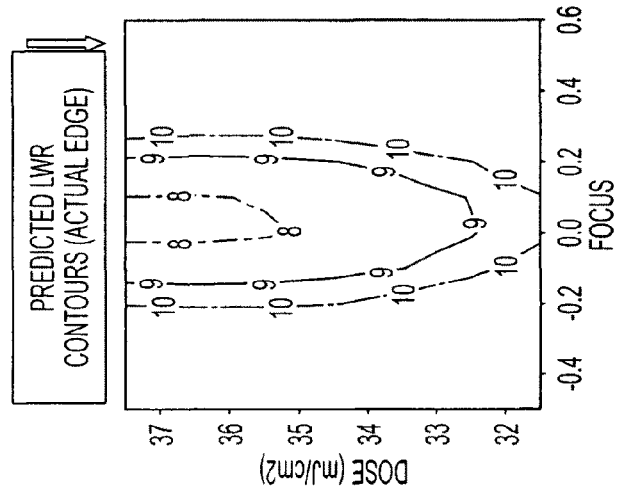
Figure 6D:
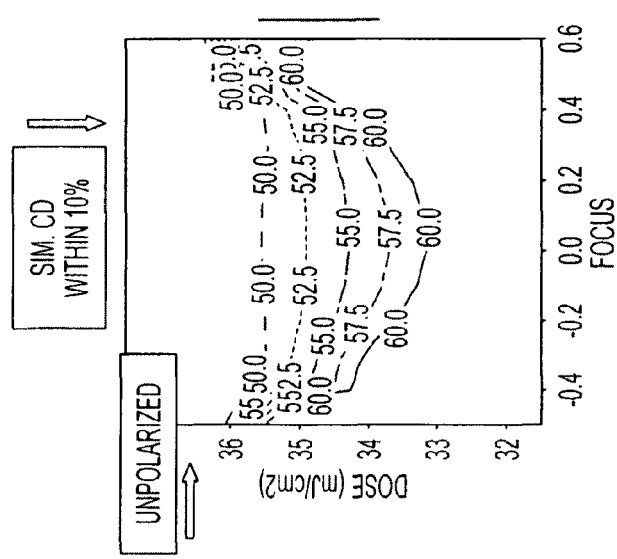

An example of the way the LWR model can be included in standard lithographic simulations is shown in FIGS. 6(a)-(c) and 6(d)-(f). FIGS. 6(a)-(c) consider the case of polarized illumination and illustrates plots from the model which indicate the focus:exposure process window based on CD (FIG. 6a), the LWR contours through dose and focus (FIG. 6b), and the overlapping process window where CD is within 10% of the target and LWR is less than some preset limit (8.5 used here) (FIG. 6c). FIGS. 6(d)-(f) illustrate the analogous results without polarization. Upon review of the figures, it is shown that the overlapping process window is much smaller without polarization, primarily because of the higher LWR.

Figure 7:
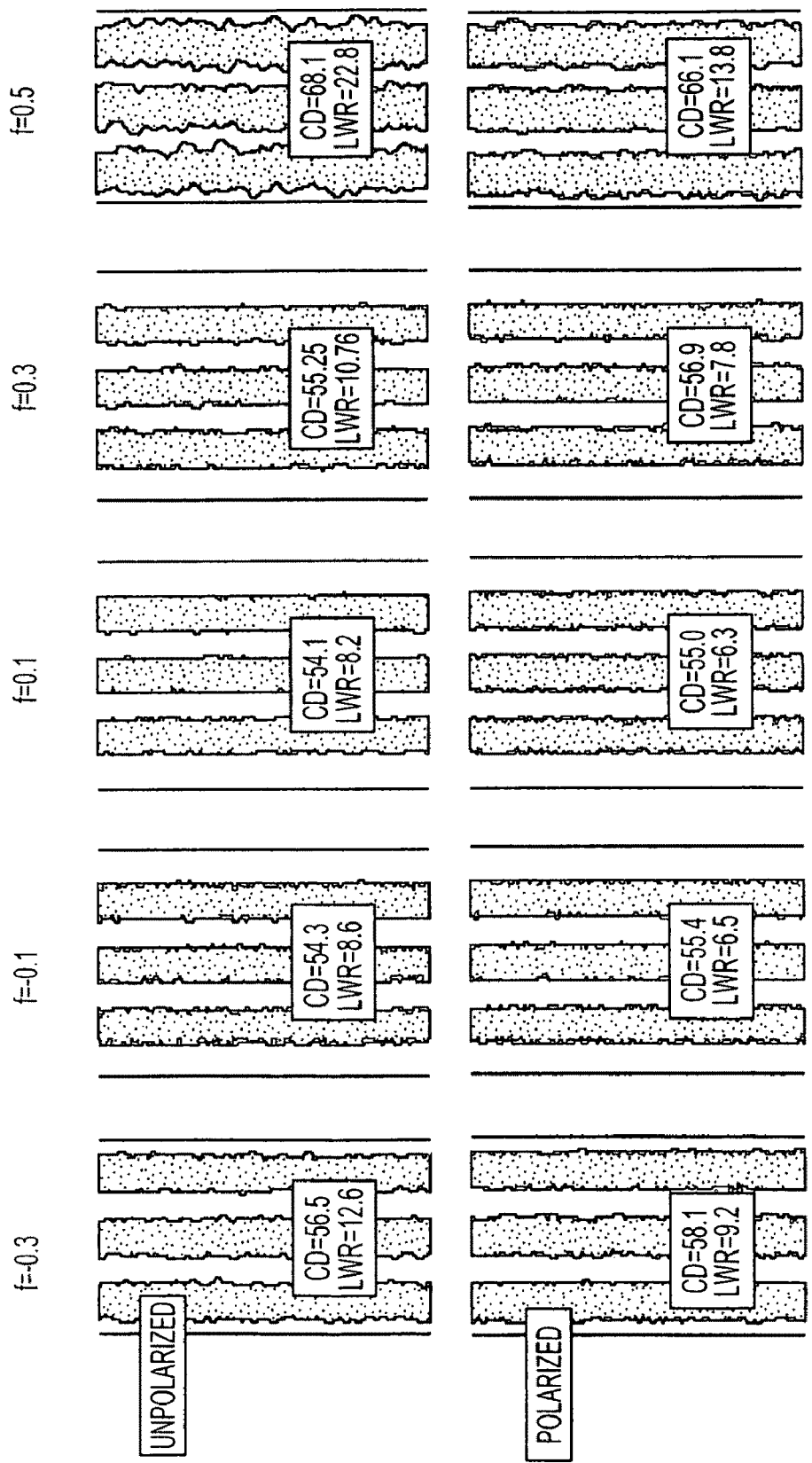
FIG. 7 illustrates another example of the how the LWR model can be utilized in a standard lithographic simulation process.

FIG. 7 illustrates another example of the utility of the LWR model in a simulation program. In this case, the LWR model returns a numerical value which can be synthesized into a top-down view, similar to what would be shown in a SEM measurement of the corresponding resist feature. It is noted that noise generators can be utilized to provide the desired cosmetic result or more complex and rigorous based on experimental power spectral density measurements, or similar treatments of the roughness can be used.

Figure 8A:
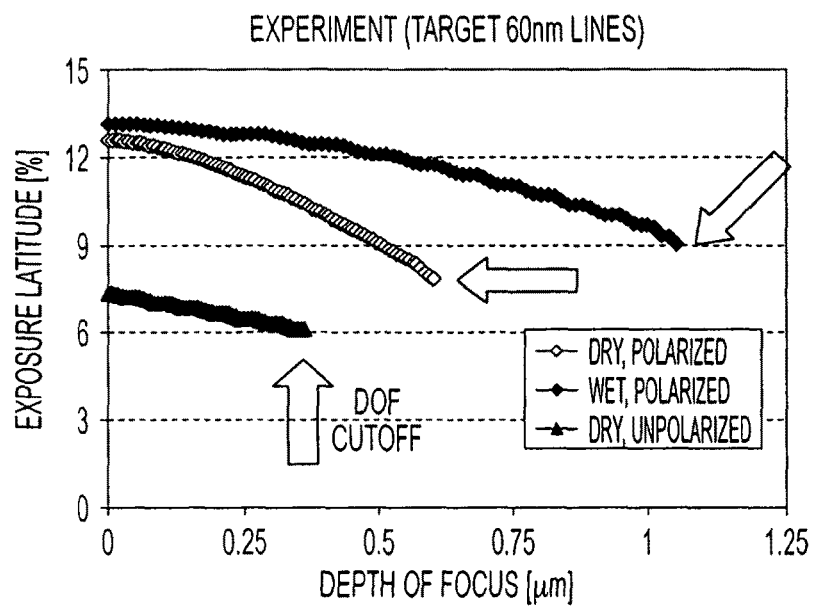
FIGS. 8a and 8b illustrate a comparison of process windows in the form of EL vs. DOF curves for experimental data and model predictions.
Figure 8B:
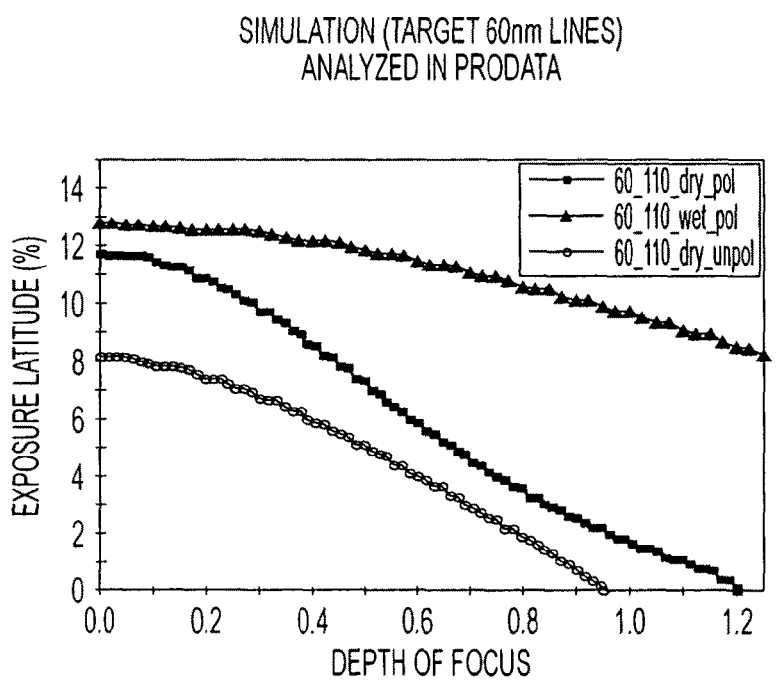

As noted above, pattern failure is also a major problem and difficult aspect for accurate photolithographic modeling. An example of the shortcomings of standard models is shown in FIGS. 8a and 8b, which compares process windows in the form of EL vs. DOF curves for experimental data and model predictions. The results are for printing 60 nm 1:1 lines with 0.93 NA and dipole illumination with three differences: 1) dry system unpolarized, 2) dry system polarized, and 3) water immersion system polarized. As shown in FIG. 8b, the calibrated model predicts the dose latitude and general shapes of the curves reasonably well with one major exception—all of the experimental curves shown in FIG. 8a (which represent the actual imaging result) are abruptly truncated due to pattern failure, while the simulation result predicts much higher DOF. It is this discrepancy that is addressed by the pattern failure model of the present invention.

Figure 9:
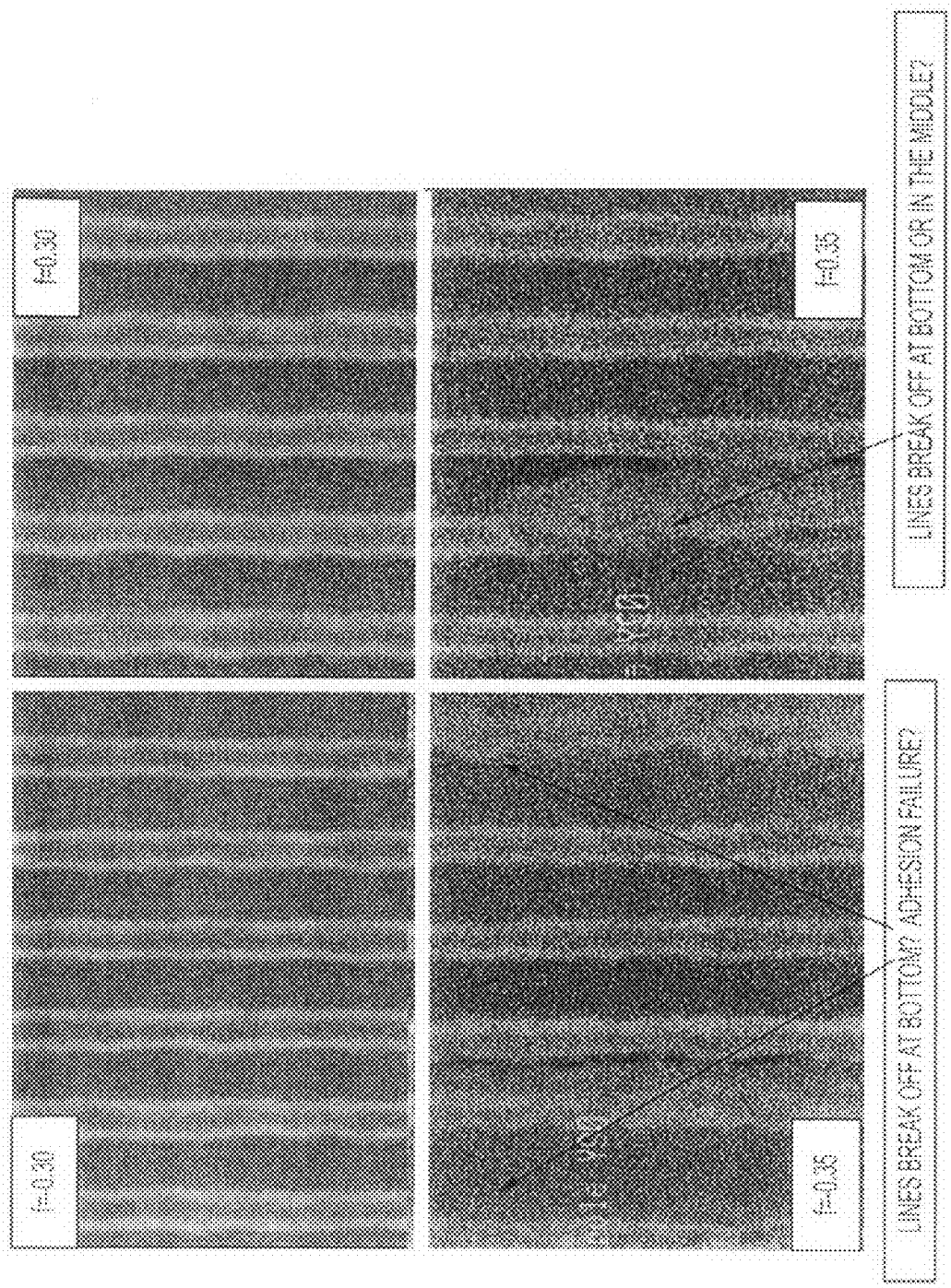
FIG. 9 is an exemplary SEM image illustrating an example of pattern failure.

FIG. 9 examines the nature of the experimental truncation. Referring to FIG. 9, it is shown that the resist images at 0.30 and −0.30 u focus setting (as well as all in between, not shown) are fine and will print, and CDs are measurable and near the target to print 1:1 lines and spaces. However, the images just 0.05 u further out show a problem with the lines falling over and the pattern is failing, i.e. not usable for production and cannot even be reliably measured. With regard to the patterns that remain, the CD is good as is typically predicted by the simulation program, but the pattern has failed, which is not predicted by current simulation models.

Examination of several experimental datasets led to the conclusion that pattern failure in dense lines for a particular resist process can be predicted reasonably well by simply invoking two criteria: 1) a CD smaller than some minimum value would not be resolved without failing, and 2) below some critical LI$_{slope}$ at the developed feature edge, the pattern would also fail. The former criteria is expected as it is known that beyond some critical aspect ratio, capillary forces in the develop and rinse process causes lines to fall over. However, the LI$_{slope}$ constraint is less intuitive; the simulation model indicates that the feature should be printed with an acceptable CD (often well above the critical minimum CD), and the lines which do not fail are in agreement with this CD, but some other mechanical failure occurs when the LI$_{slope}$ quality falls below a critical value.

Figure 10:
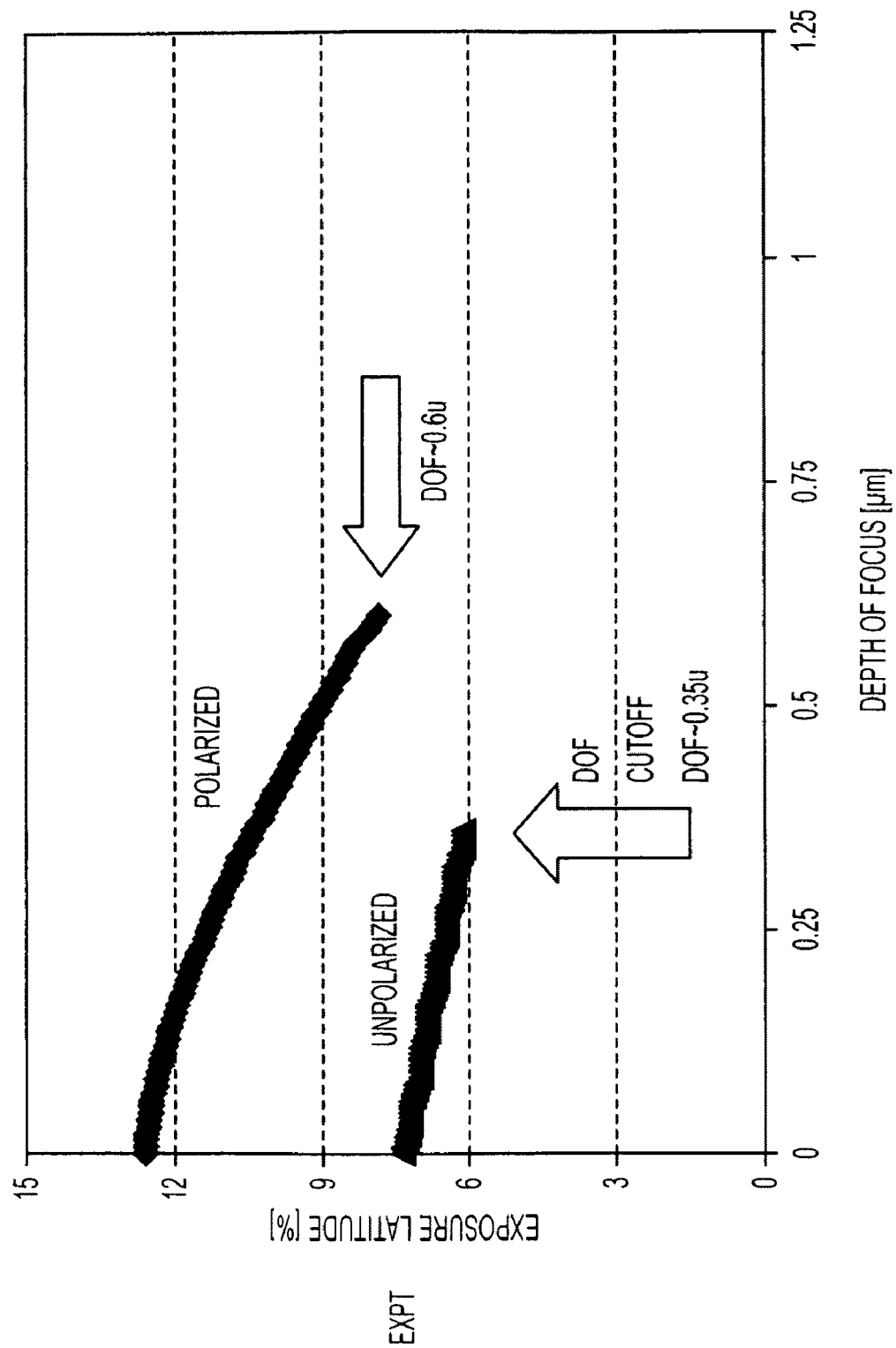
FIG. 10 illustrates experimental EL vs. DOF results for 55 nm 1:1 lines printed with 0.93 NA and dipole illumination.
Figures 11A, 11B, 11C:
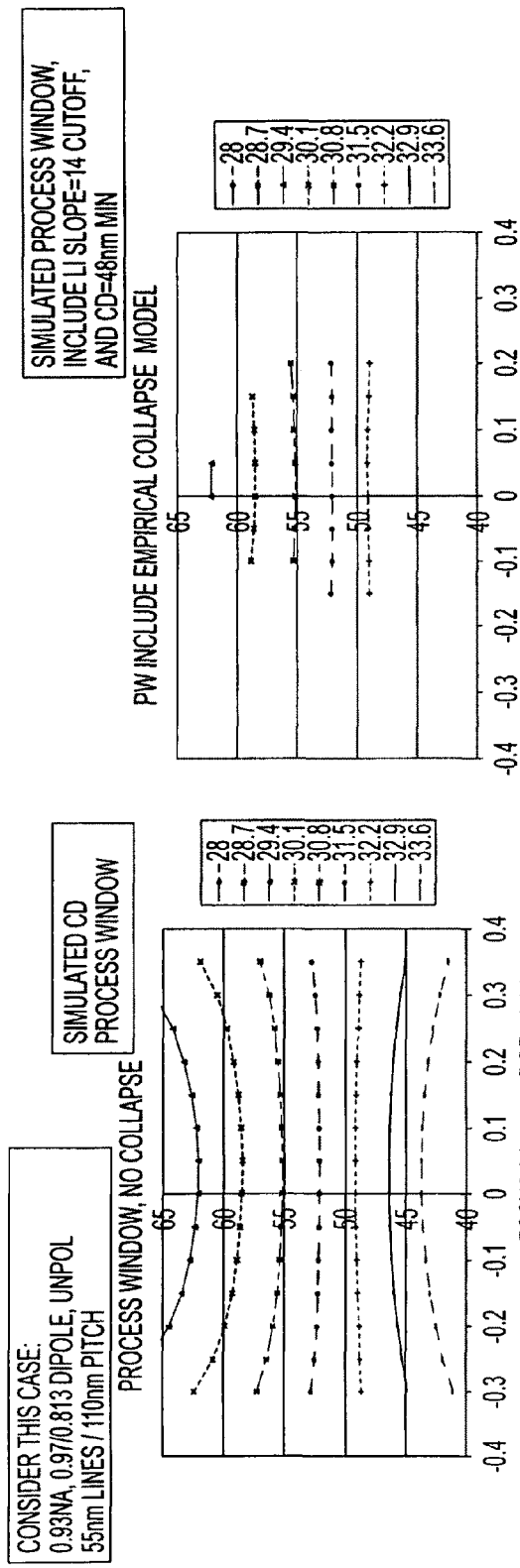
FIGS. 11(a)-11(c) illustrate simulation results regarding predicting CDs through focus and dose.

Examples of the foregoing are provided in FIGS. 10 and 11(a)-(c). FIG. 10 illustrates the experimental EL vs. DOF results for 55 nm 1:1 lines printed with 0.93 NA and dipole illumination. The abrupt cutoff in focus can be seen and it occurs much earlier for unpolarized illumination than polarized. In contrast. FIG. 11a illustrates the results of a simple simulation process predicting CDs through focus and dose for the unpolarized case. As is clear, the expected DOF is almost twice as high as the experimental/actual value. FIG. 11b truncates the simulation results with the following two rules based on the empirical data: for a feature to be good and measurable the CDmin>48 nm and LIslope>14. The physical interpretation is that CDs less than 48 nm (overexposed case) fall over, while features with critically poor latent image quality (defocused case) also fail. With these criteria, the simulated DOF matches experiment. FIG. 11c shows the analogous result for the polarized case, and again the simulation is shown to match the experimental DOF in FIG. 10.

Figure 12A:
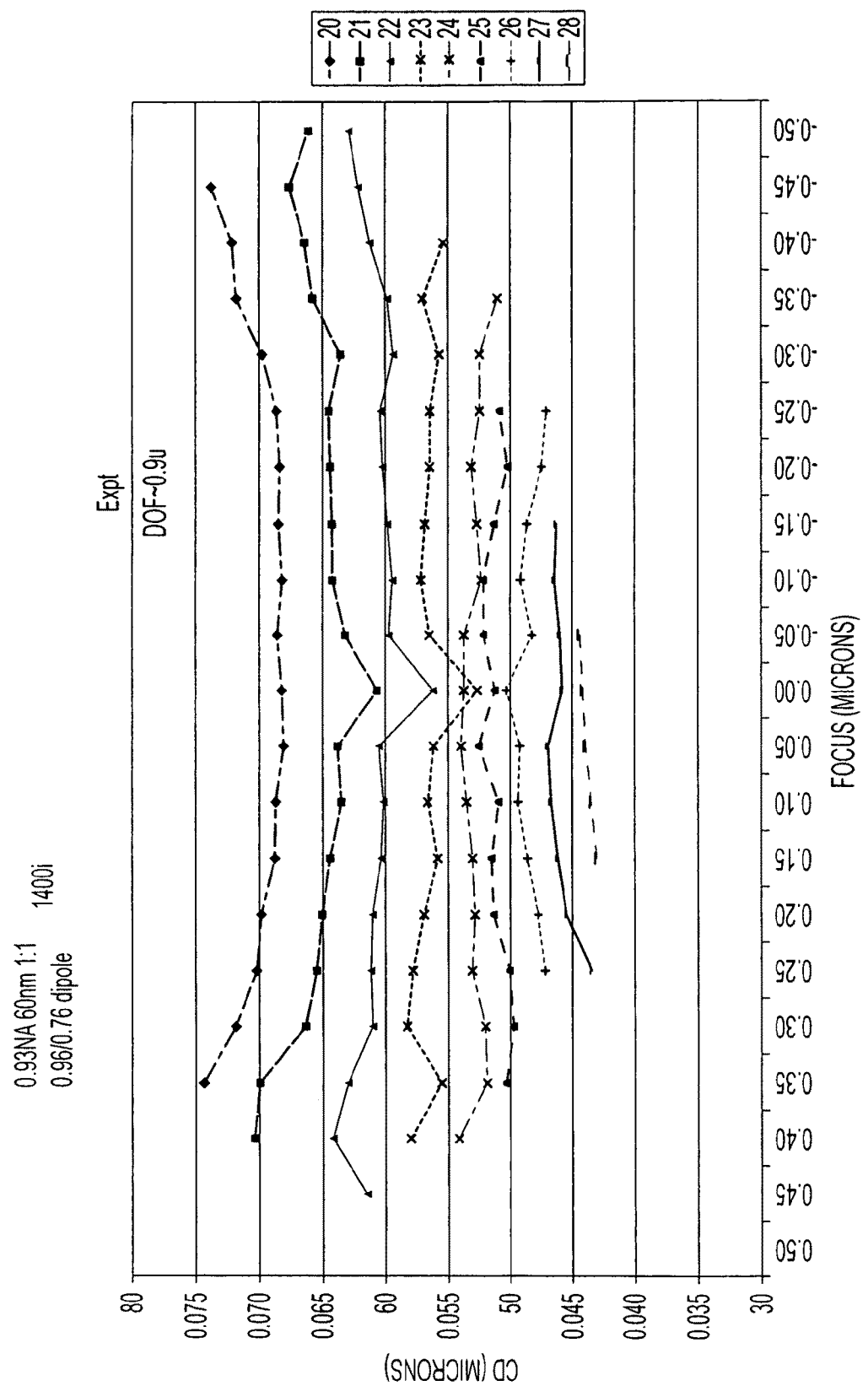
FIGS. 12(a)-12(c) illustrate an application of the three parameter pattern failure model of the present invention.
Figure 12B:
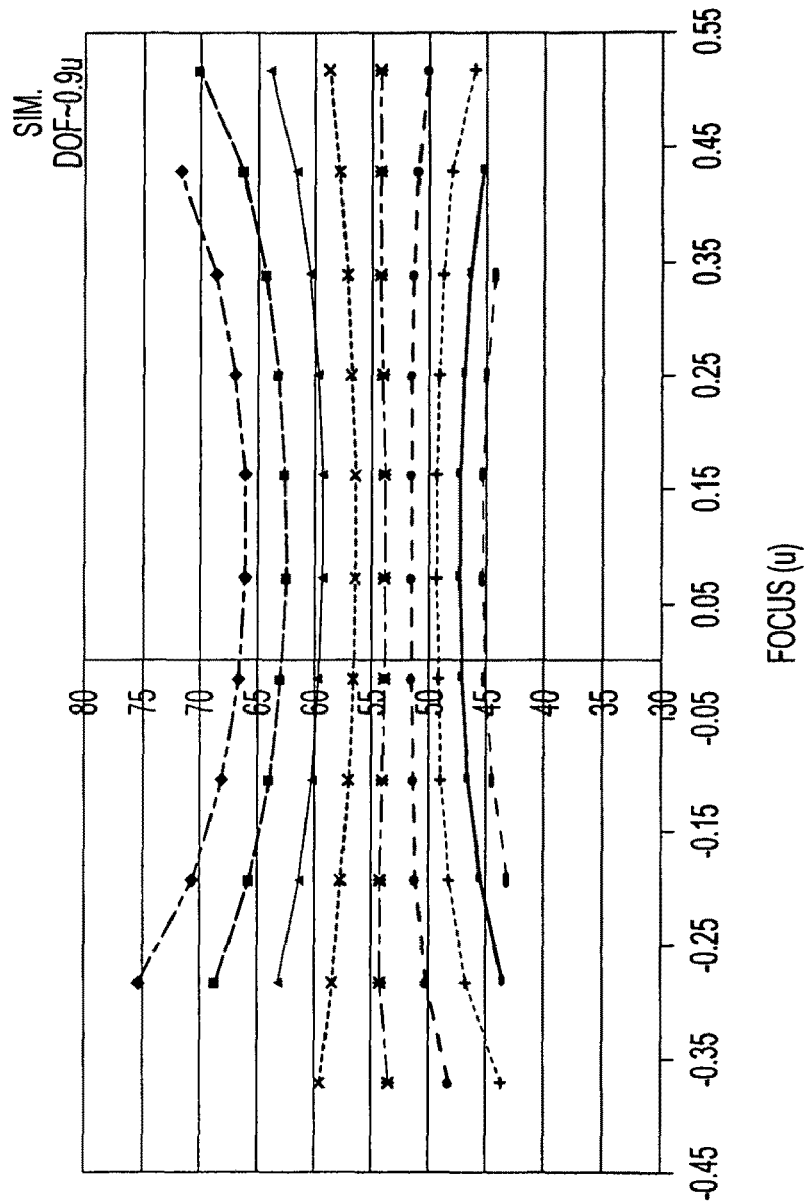
Figure 12C:
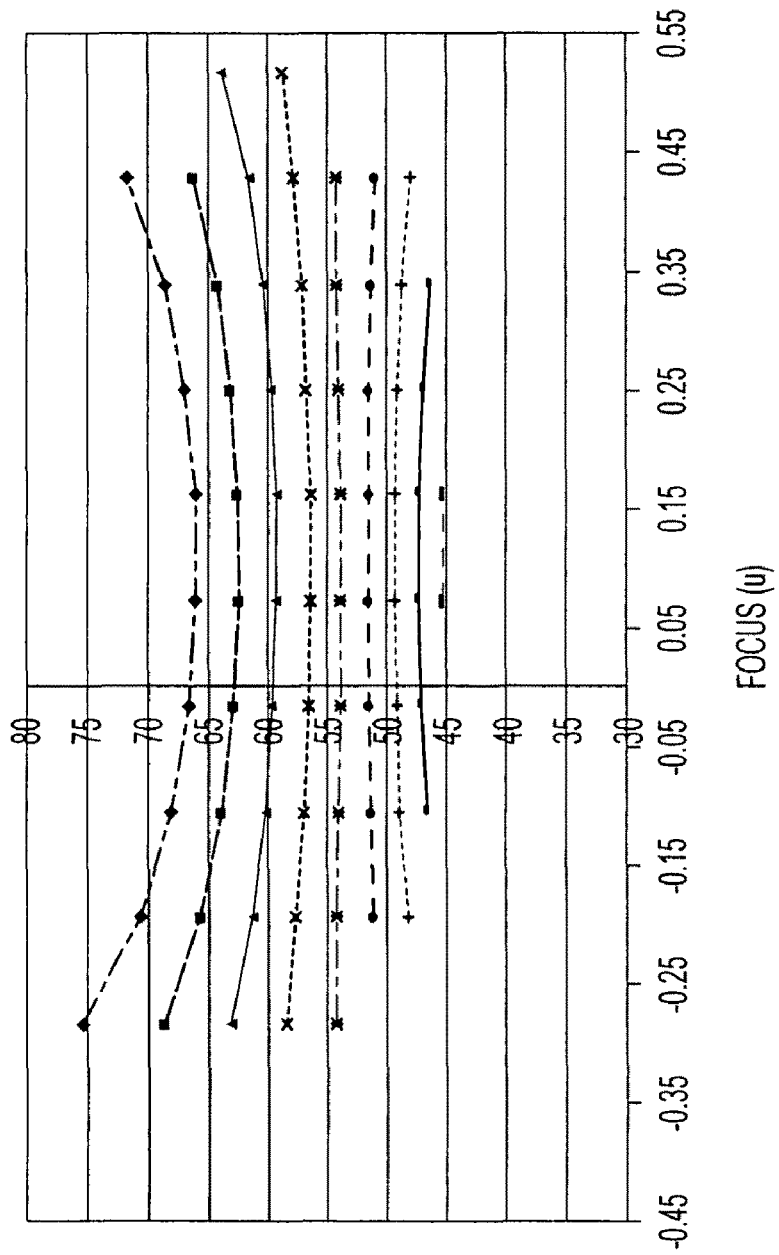

While this 2-parameter pattern failure model is quite useful, FIGS. 12a-12c show that additional refinement by adding a $3^{rd}$ parameter further improves the match between the simulated result and the experimental or actual result. Specifically, FIG. 12a shows experimental FEM measurements for 60 nm 1:1 lines produced with dipole illumination at 0.93 NA in a water immersion system. FIG. 12b shows the best match of simulation when the simple 2-parameter model is applied (which is obtained by fitting the 2-parameter model to the experimental data). A problem area exists where the model predicts more good points when overexposed and defocused than actually appear on the wafer. These points have the characteristic that the CDs are small, approaching but still above the critical CDmin, and also, in defocus, the latent image slope is degraded though still above the critical value. By adding a $3^{rd}$ criteria that allows for failure above the critical limits but when near failure for both, helps solve this problem as shown in FIG. 12c, where the agreement between the simulated result and the experimental result is improved. This three parameter model is defined as follows:

1. $CD>CD_{min}$
2. $LI_{slope}>LI_{slopemin}$
3. $(CD-CD_{min})*(LI_{slope}-LI_{slope\,min})>C_{ct}*CD_{min}$ (3-parameter model)

Figure 13A:
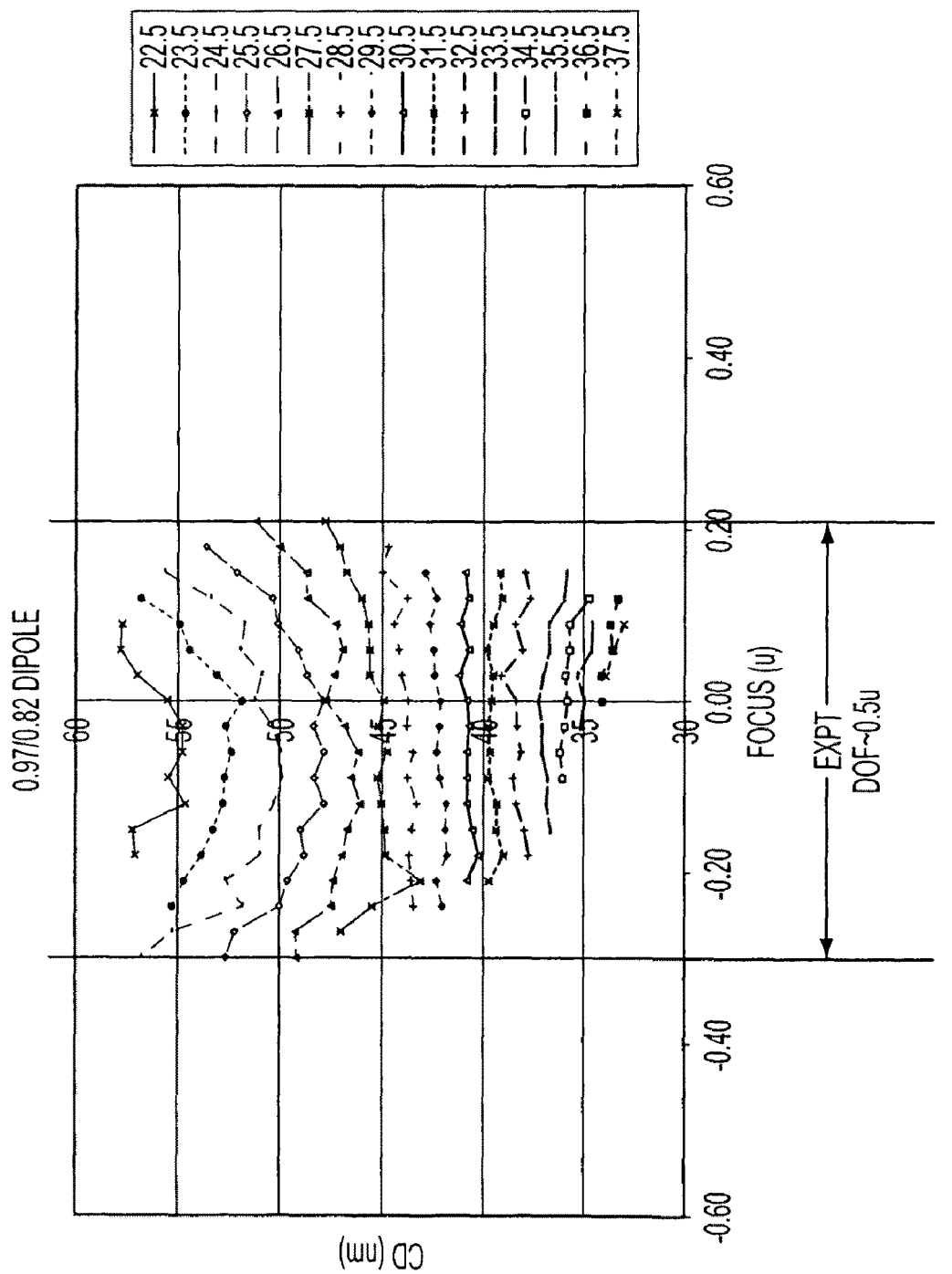
FIGS. 13(a)-13(b) illustrate another application of the three parameter pattern failure model of the present invention.
Figure 13B:
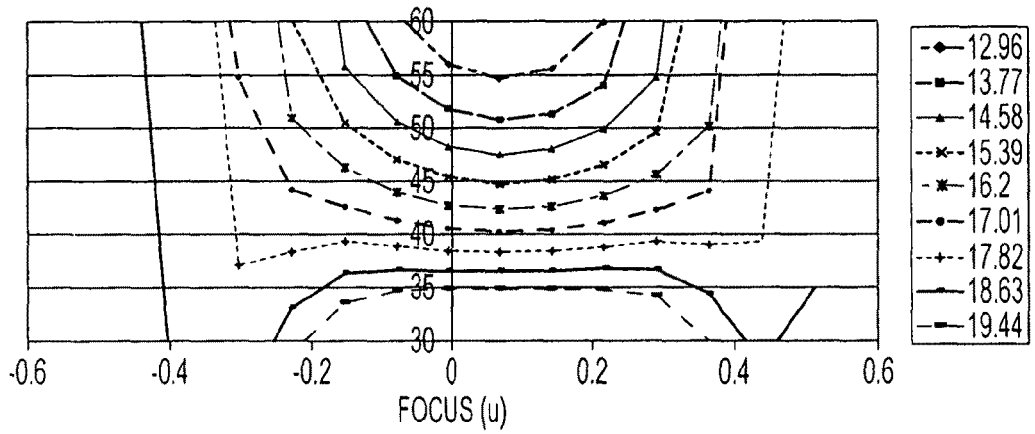
Figure 13B:
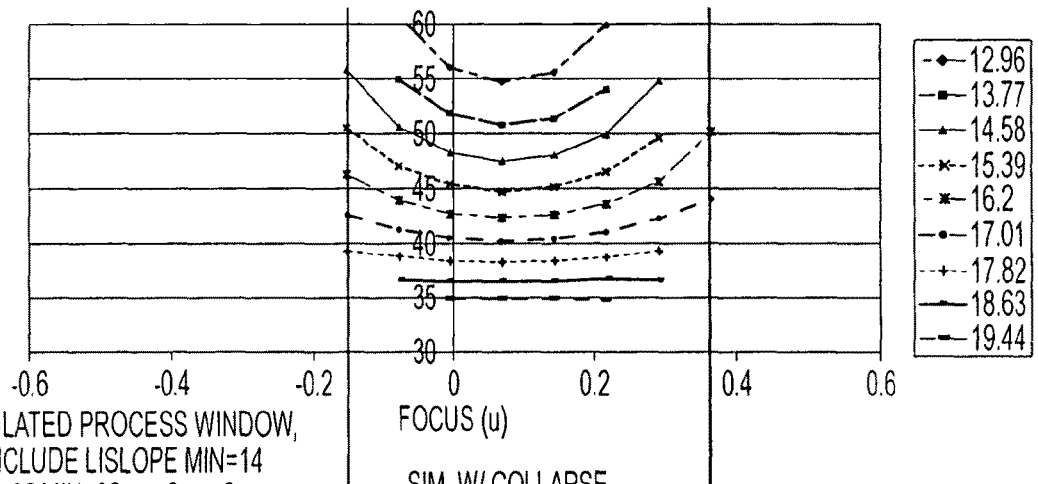

It is noted that the values of $CD_{min}$, $LI_{slope\,min}$, and $C_{ct}$ are determined by a comparison of the experimental data and the model predictions so as to determine the parameters values such that the simulation result most closely matches the experimental data with a minimal number of errors (i.e., predicting a pattern failure where none occurs, or vise versa). Another example of the ability of the model to successfully estimate the actual experimental results is shown in FIGS. 13a and 13b, which uses a different resist process and examines 45 nm 1:1 lines with 1.2 NA dipole illumination. The experimental DOF is ~0.5 u while the simple matched simulation prediction is 0.7 u. When the 3-parameter pattern failure criterion is added then the DOF match is improved as is the predicted shape of the measured Bossung plot.

Figure 14A:
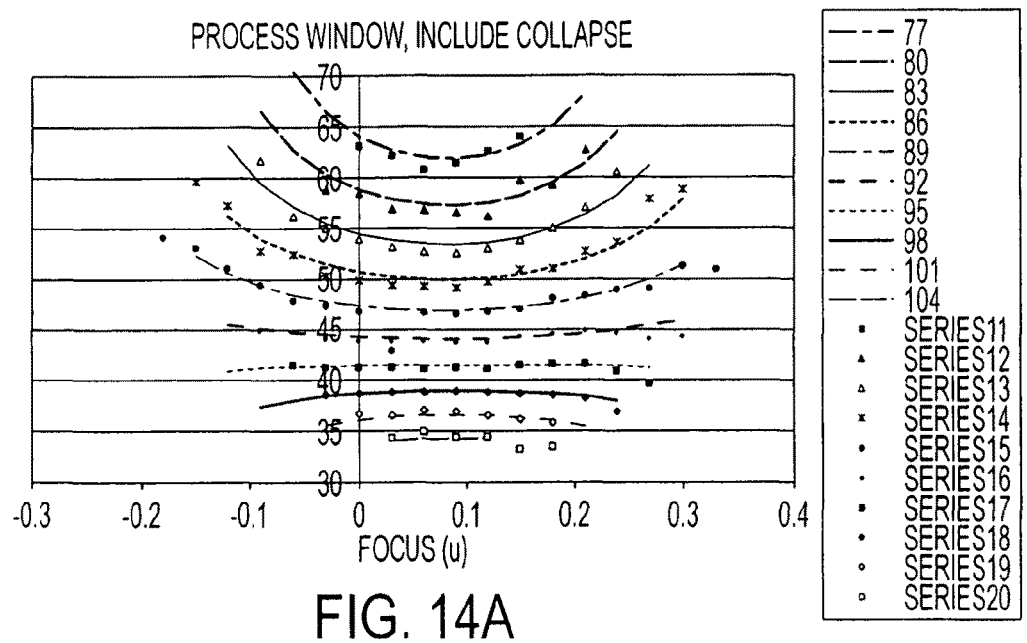
FIGS. 14(a)-14(b) illustrate yet another application of the three parameter pattern failure model of the present invention.
Figure 14B:
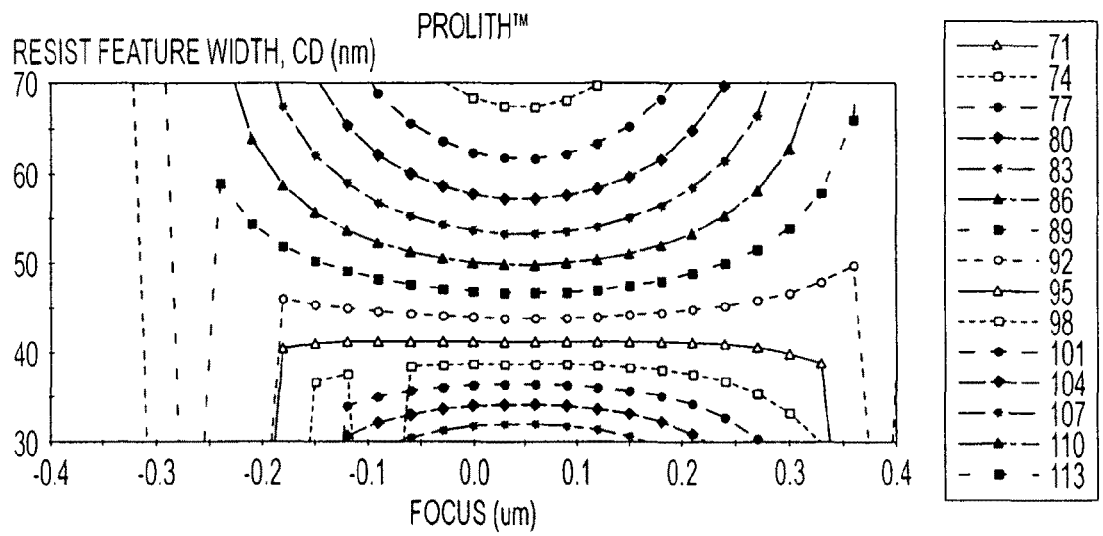

Yet another example is shown in FIGS. 14a and 14b. It is noted that FIG. 14a is a repeat of FIG. 4b. In this example, the experimental data (the plotted discrete points) and the simulation results including the 3-parameter failure criterion are overlayed. It is shown that the agreement between the simulated result and the experimental result is quite good. The process is for 50 nm 1:1 lines produced with 1.2 NA and 0.94/0.74 annular illumination and the best model parameters are:

| Cdmin | LI slope min | Cct |
|---|---|---|
| 31 | 13 | 1.9 |

FIG. 14b shows the simulation result without including pattern failure and its over-prediction of the process window is clear. It is noted that this dataset is the same as used for the LWR analysis of FIG. 5 and so, taken together, it is shown that including these empirical models it is possible to 1) predict CDs, 2) predict LWR, and 3) predict pattern failure.

Figure 15:
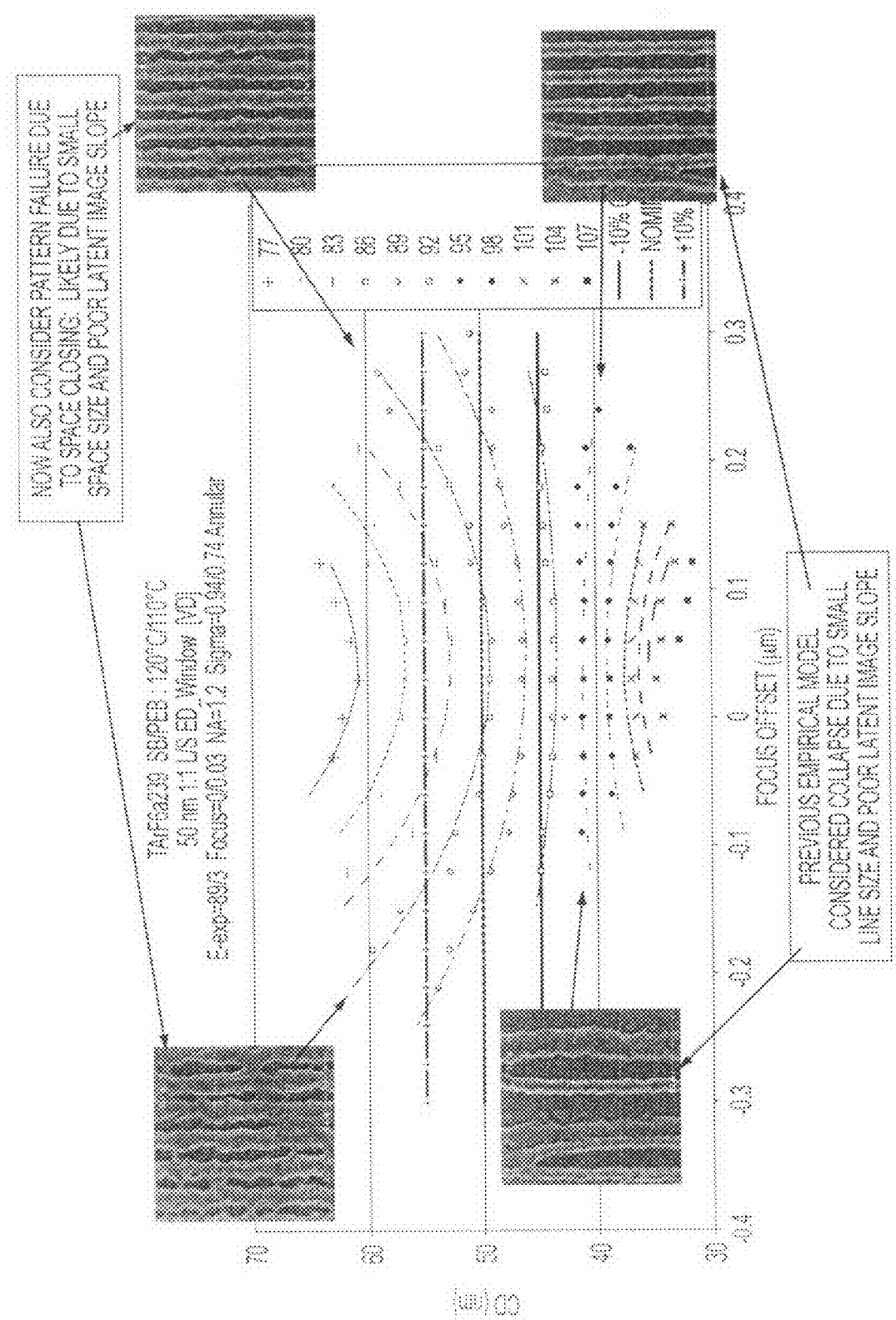
FIG. 15 illustrates experimental data including SEM images at the edge of focus and illustrates that pattern failure can involve both pattern collapse and space closing.

Further refinement of the pattern failure model is also possible. FIG. 15 shows experimental data including SEM images at the edge of focus which makes clear that pattern failure can involve both pattern collapse for small lines and also "premature space closing" for small spaces. In a second embodiment of the pattern failure model, two more terms can be added to the first pattern failure model discussed above to include this effect. In such a case, the model becomes:

1. $CD>CD_{min}$
2. $LI_{slope}>LI_{slope\,min}$ (if $CD_{line}>CD_{space}$)
3. $(CD-CD_{min})*(LI_{slope}-LI_{slope\,min})>C_{ct}*CD_{min}$
4. pitch-$CD>Space_{min}$
5. $LI_{slope}>LI_{slope\,min2}$ (if $CD_{space}>CD_{line}$) (5-parameter model)

Once again, the values of the model $CD_{min}$, $LI_{slope\,min}$, $C_{ct}$, $Space_{min}$, and $LI_{slope\,min2}$ are determined by a comparison of the experimental data and the parameter values so as to determine the parameters values such that the simulation result most closely matches the experimental data with the minimal number of errors (i.e., predicting a pattern failure where none occurs, or vise versa).

Figure 16A:
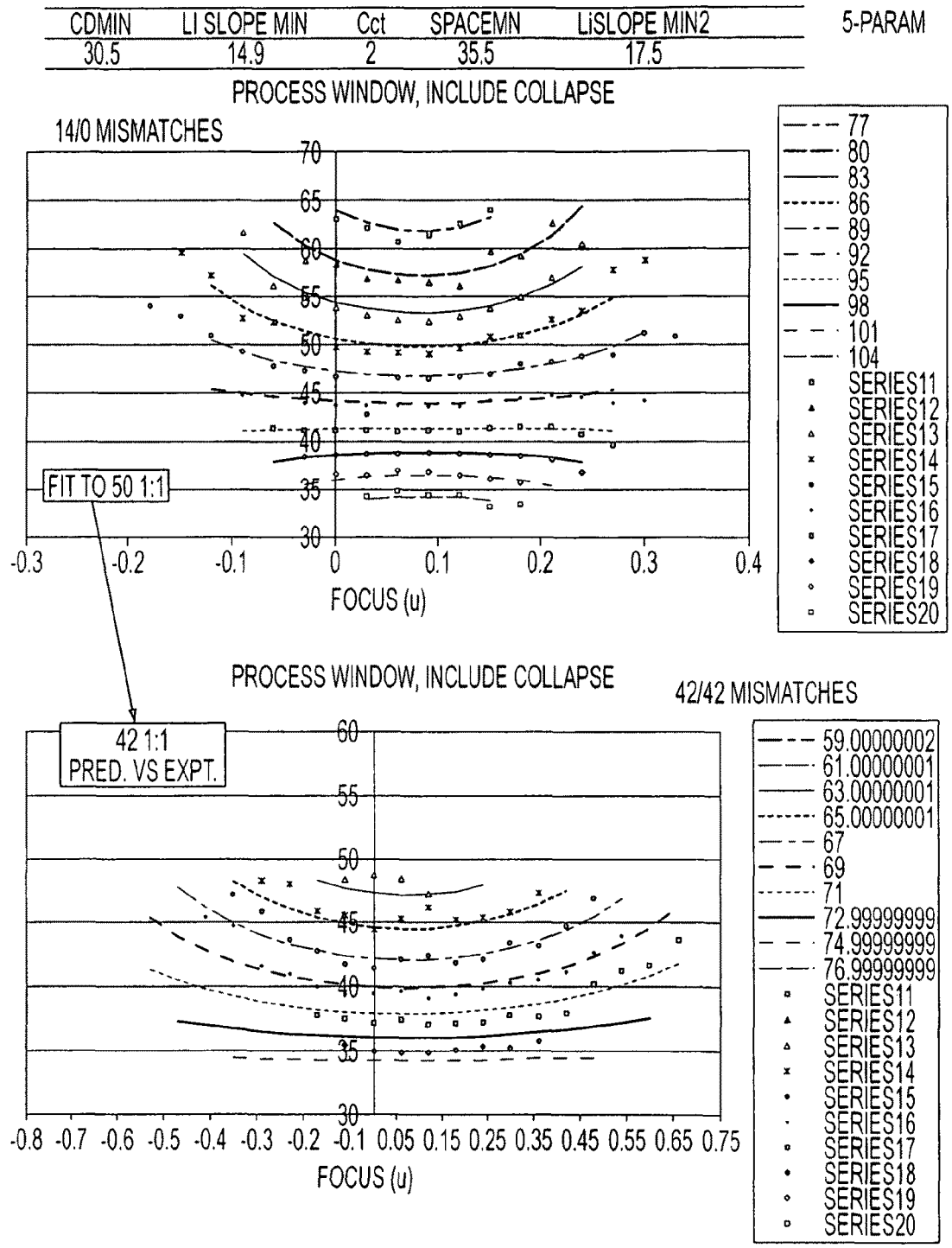
FIGS. 16a and 16b illustrate a comparison between the performance of the three parameter pattern failure model and the five parameter pattern failure model of the present invention.
Figure 16B:
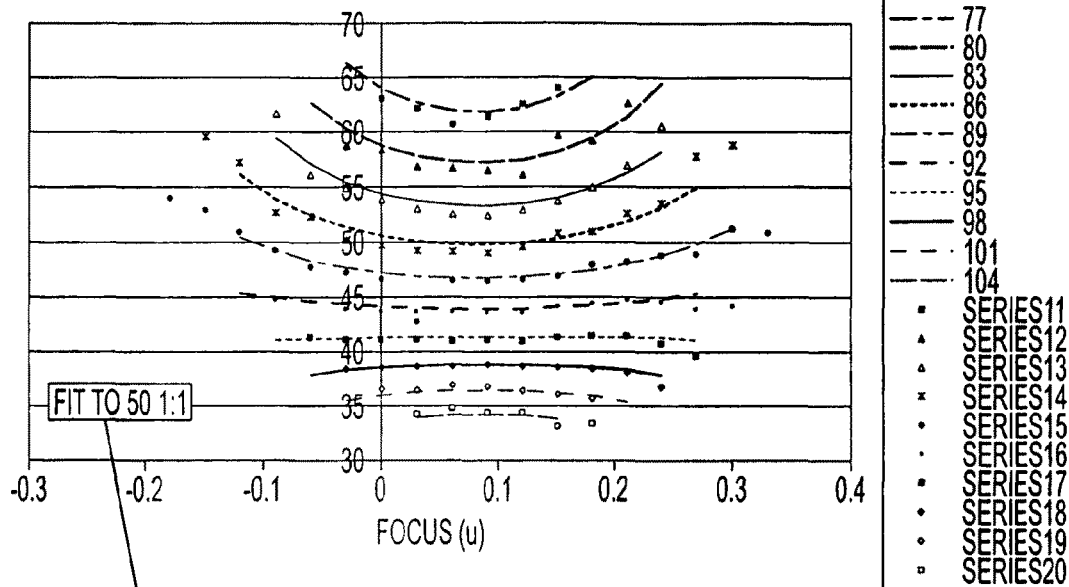
Figure 16B:
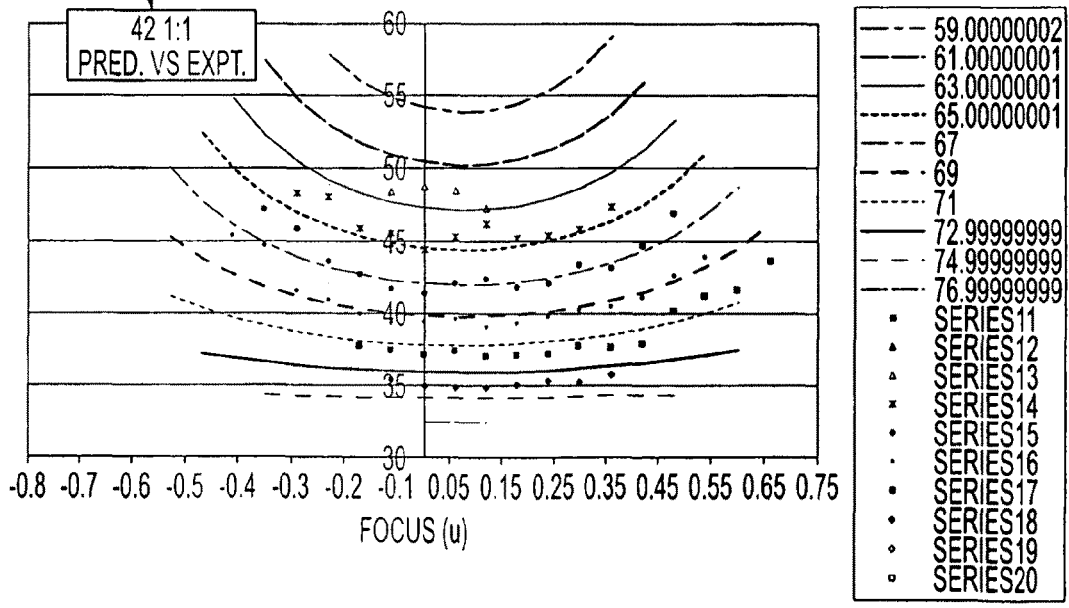

FIGS. 16a and 16b show the utility of the model. When the 5 parameter model is calibrated to match 50 nm 1:1 annular data, its prediction for 42 nm 1:1 dipole data is much better than the prediction of the 3-parameter model. FIG. 16b which used the 3-parameter model predicts much better performance in underexposure (small spaces) than is observed by the experiment. FIG. 16a shows that the 5-parameter model reduces this discrepancy.

Figure 17A:
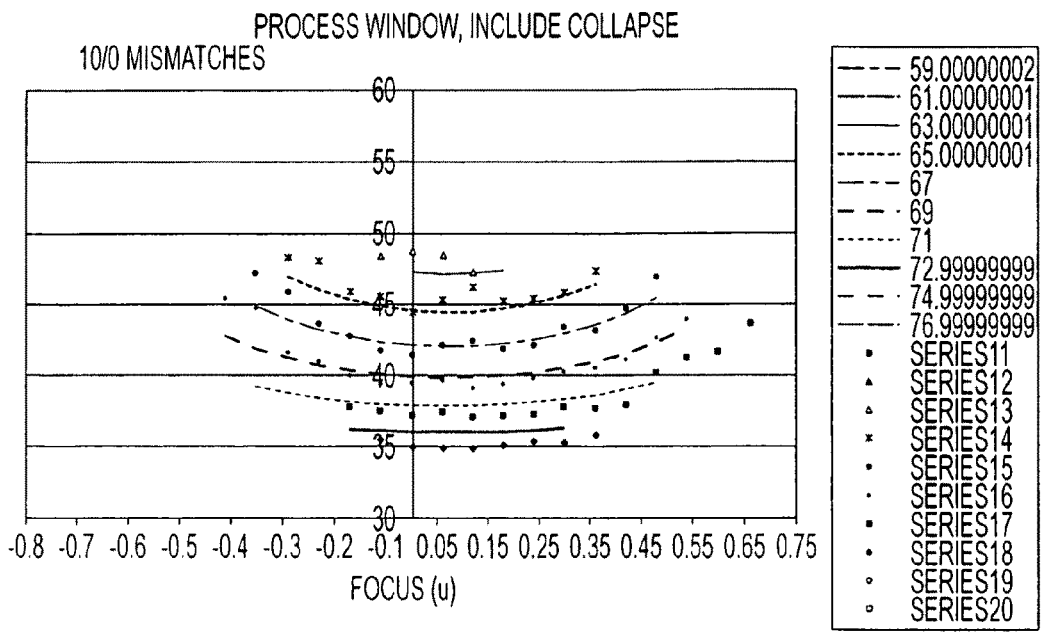
FIGS. 17a-17c illustrate an exemplary application of the five parameter pattern failure model
Figure 17B:
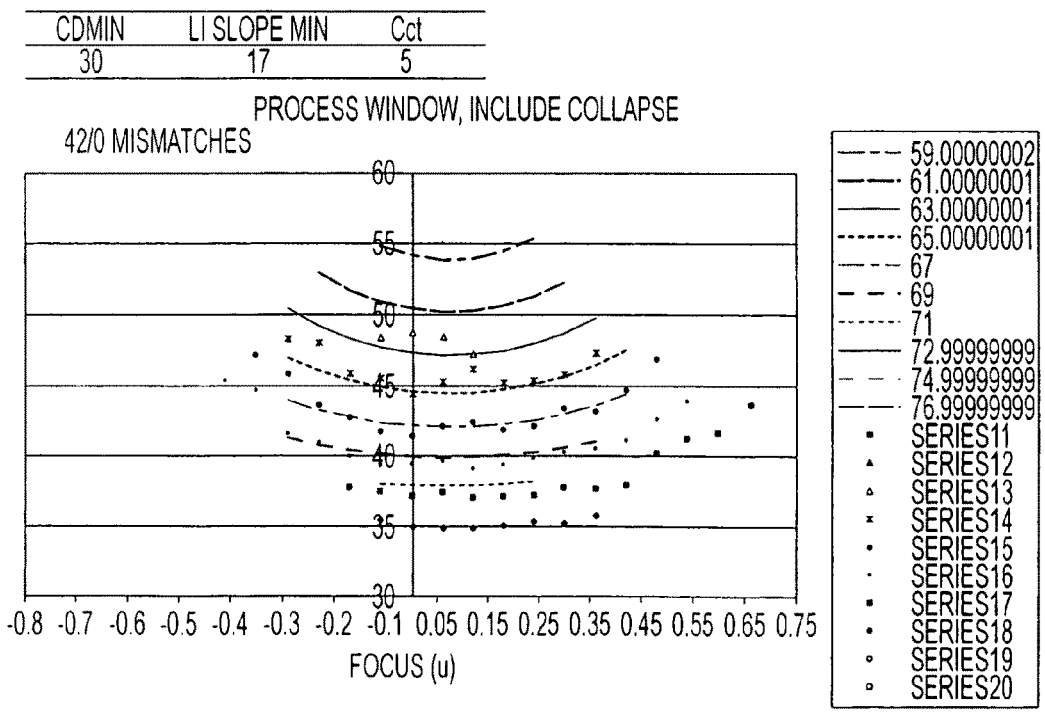
Figure 17C:
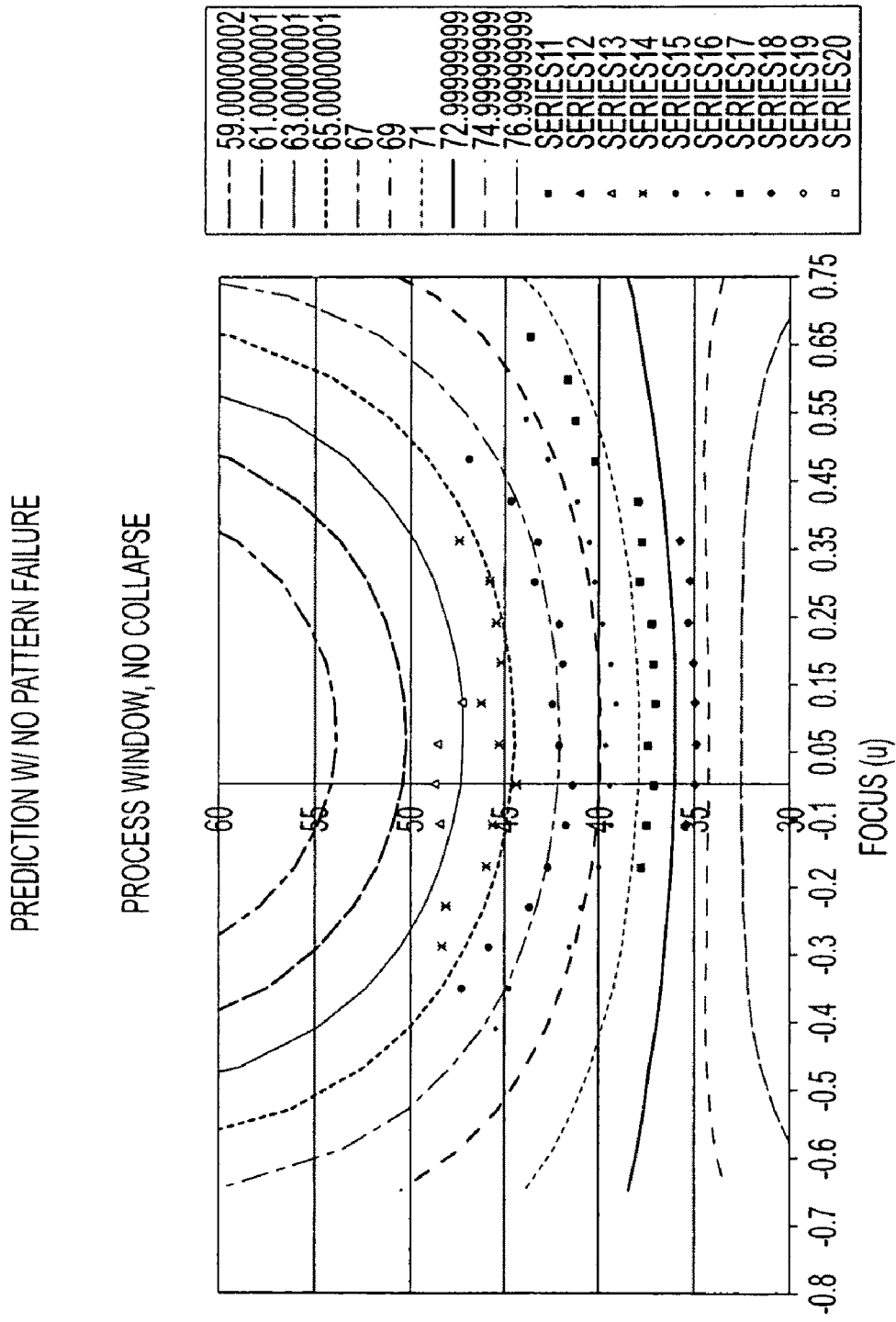

FIGS. 17a-17c make this point more clearly. Here the models are directly fitted to the 42 nm 1:1 data. FIG. 17a shows a good match with the 5-parameter model while FIG. 17b shows a worse match, particularly in underexposure for the 3-parameter model. FIG. 17c shows the prediction with no pattern failure considered.

Figure 18:
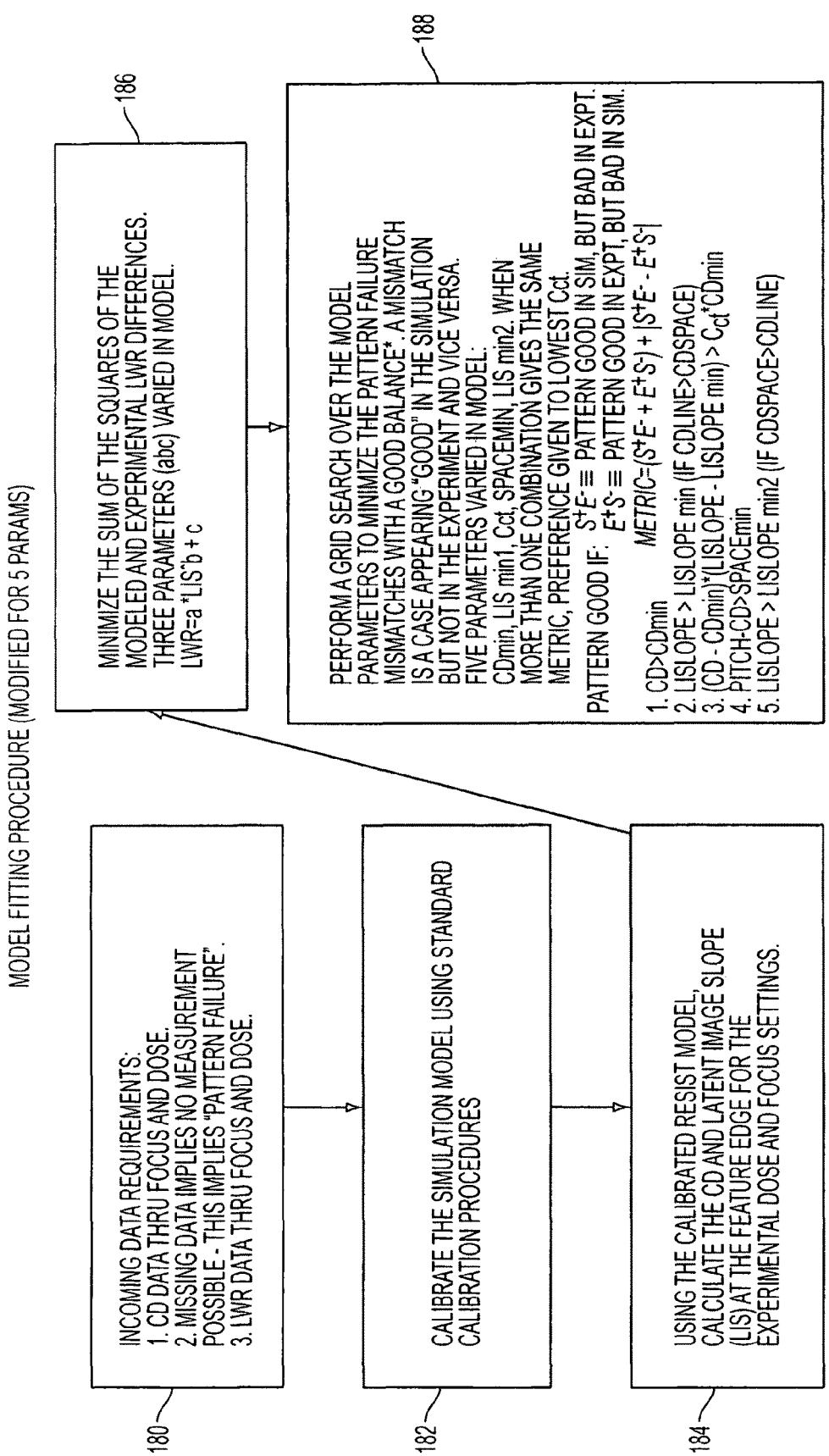
FIG. 18 illustrates an exemplary flowchart regarding the generation of the LWR model and the pattern failure models.

FIG. 18 illustrates an exemplary flowchart regarding the generation of the LWR model and the pattern failure model noted above. In the first step of the process 180, actual imaging results are obtained for the given resist process to be utilized. The experimental data points are taken through focus and dose. Typically, the measured data is the resulting CD, however, other measurements are also possible. As noted above, the foregoing models are resist process dependent and the calibration of the model (i.e., determination of the model parameters) should be re-performed if the resist process is modified. The next step (Step 182) is to calibrate the given simulation model being utilized (it is noted that any prior art simulation model in which the value of the $LI_{slope}$ is available as an intermediary value may be utilized). This step corresponds to a typical simulation model calibration process. In the next step (Step 184), using the calibrated resist model, determine the simulated CD values and corresponding the $LI_{slope}$ values generated by the simulation model which correspond to the experimental (i.e., actual) imaging results. Then (Step 186), the three parameters in the LWR model are determined by fitting the three parameters of the LWR model to the experimental data such that the simulation results of the LWR model most closely match the experimental results. This can be accomplished for example, by minimizing the sum of the squares of the modeled and experimental LWR differences. Thereafter, in the final step (Step 188), either the three parameters or five parameters of the pattern failure model are determined by a comparison of the experimental data and the parameter values so as to determine the parameters values such that the simulation result most closely matches the experimental data with the minimal number of errors (i.e., predicting a pattern failure where none occurs, or vise versa).

In a variation of the foregoing method of determining the parameters associated with the pattern failure model, it is also possible to introduce an additional metric to be minimized, which is:

$$\text{metric} = (S^+E^- + E^+S^-) + |S^+E^- - E^+S^-|,$$

wherein $S^+E^-$ indicates that the pattern is good in simulation, but fails in experimental result, and $E^+S^-$ indicates that the pattern is good in the experimental results but fails in simulation. The purpose of this metric is to balance the two types of possible errors when fitting the parameters of the model to the experimental data.

It is noted that while specific mathematical functions have been disclosed above, other formula having additional parameters may also be utilized. Further, as opposed to calibrating the parameters of the LWR model and pattern failure model over variations of focus and dose, a one point calibration can be utilized (for example, at best focus and best dose). Of course, other variations are also possible.

Figure 19:
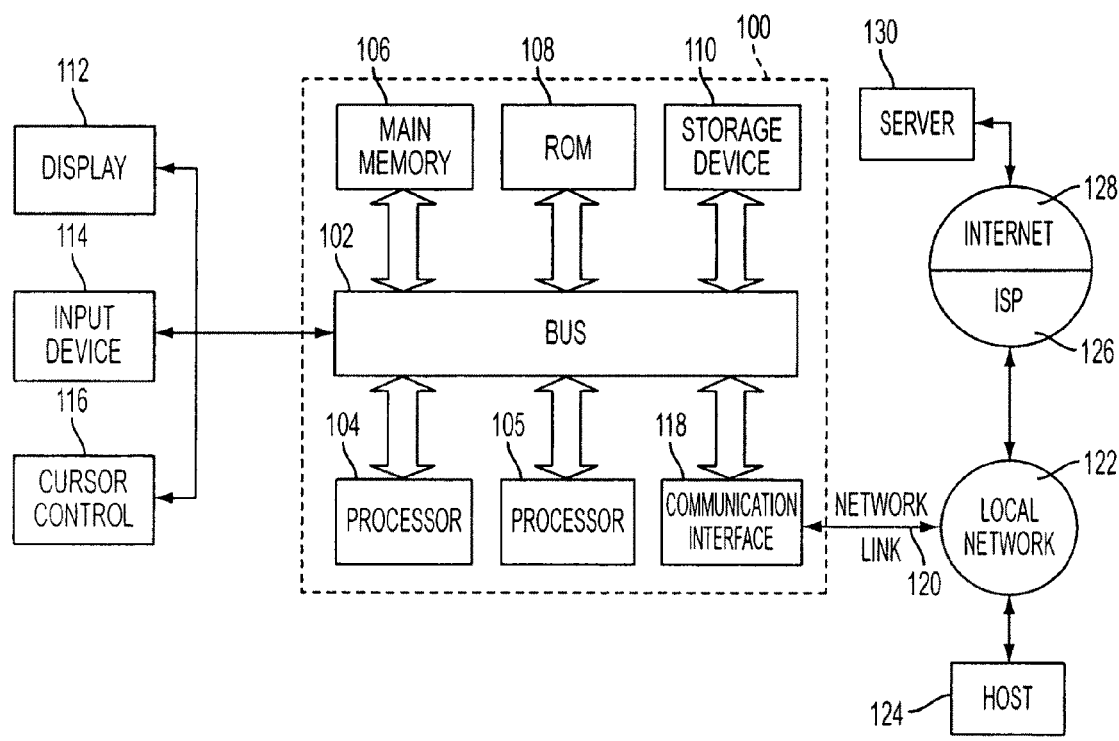
FIG. 19 is a block diagram that illustrates a computer system 100 which can assist in the generation of a LWR model and the pattern failure models of the present invention.

FIG. 19 is a block diagram that illustrates a computer system 100 which can assist in the generation and use of the LWR and pattern failure models in accordance with the present invention. Computer system 100 includes a bus 102 or other communication mechanism for communicating information, and a processor 104 coupled with bus 102 for processing information. Computer system 100 also includes a main memory 106, such as a random access memory (RAM) or other dynamic storage device, coupled to bus 102 for storing information and instructions to be executed by processor 104. Main memory 106 also may be used for storing temporary variables or other intermediate information during execution of instructions to be executed by processor 104. Computer system 100 further includes a read only memory (ROM) 108 or other static storage device coupled to bus 102 for storing static information and instructions for processor 104. A storage device 110, such as a magnetic disk or optical disk, is provided and coupled to bus 102 for storing information and instructions.

Computer system 100 may be coupled via bus 102 to a display 112, such as a cathode ray tube (CRT) or flat panel or touch panel display for displaying information to a computer user. An input device 114, including alphanumeric and other keys, is coupled to bus 102 for communicating information and command selections to processor 104. Another type of user input device is cursor control 116, such as a mouse, a trackball, or cursor direction keys for communicating direction information and command selections to processor 104 and for controlling cursor movement on display 112. This input device typically has two degrees of freedom in two axes, a first axis (e.g., x) and a second axis (e.g., y), that allows the device to specify positions in a plane. A touch panel (screen) display may also be used as an input device.

Determination and calibration of the models may be performed by computer system 100 in response to processor 104 executing one or more sequences of one or more instructions contained in main memory 106. Such instructions may be read into main memory 106 from another computer-readable medium, such as storage device 110. Execution of the sequences of instructions contained in main memory 106 causes processor 104 to perform the process steps described herein. One or more processors in a multi-processing arrangement may also be employed to execute the sequences of instructions contained in main memory 106. In alternative embodiments, hard-wired circuitry may be used in place of or in combination with software instructions to implement the invention. Thus, embodiments of the invention are not limited to any specific combination of hardware circuitry and software.

The term "computer-readable medium" as used herein refers to any medium that participates in providing instructions to processor 104 for execution. Such a medium may take many forms, including but not limited to, non-volatile media, volatile media, and transmission media. Non-volatile media include, for example, optical or magnetic disks, such as storage device 110. Volatile media include dynamic memory, such as main memory 106. Transmission media include coaxial cables, copper wire and fiber optics, including the wires that comprise bus 102. Transmission media can also take the form of acoustic or light waves, such as those generated during radio frequency (RF) and infrared (IR) data communications. Common forms of computer-readable media include, for example, a floppy disk, a flexible disk, hard disk, magnetic tape, any other magnetic medium, a CD-ROM, DVD, any other optical medium, punch cards, paper tape, any other physical medium with patterns of holes, a RAM, a PROM, and EPROM, a FLASH-EPROM, any other memory chip or cartridge, a carrier wave as described hereinafter, or any other medium from which a computer can read.

Various forms of computer readable media may be involved in carrying one or more sequences of one or more instructions to processor 104 for execution. For example, the instructions may initially be borne on a magnetic disk of a remote computer. The remote computer can load the instructions into its dynamic memory and send the instructions over a telephone line using a modem. A modem local to computer system 100 can receive the data on the telephone line and use an infrared transmitter to convert the data to an infrared signal. An infrared detector coupled to bus 102 can receive the data carried in the infrared signal and place the data on bus 102. Bus 102 carries the data to main memory 106, from which processor 104 retrieves and executes the instructions. The instructions received by main memory 106 may optionally be stored on storage device 110 either before or after execution by processor 104.

Computer system 100 also preferably includes a communication interface 118 coupled to bus 102. Communication interface 118 provides a two-way data communication coupling to a network link 120 that is connected to a local network 122. For example, communication interface 118 may be an integrated services digital network (ISDN) card or a modem to provide a data communication connection to a corresponding type of telephone line. As another example, communication interface 118 may be a local area network (LAN) card to provide a data communication connection to a compatible LAN. Wireless links may also be implemented. In any such implementation, communication interface 118 sends and receives electrical, electromagnetic or optical signals that carry digital data streams representing various types of information.

Network link 120 typically provides data communication through one or more networks to other data devices. For example, network link 120 may provide a connection through local network 122 to a host computer 124 or to data equipment operated by an Internet Service Provider (ISP) 126. ISP 126 in turn provides data communication services through the worldwide packet data communication network, now commonly referred to as the "Internet" 128. Local network 122 and Internet 128 both use electrical, electromagnetic or optical signals that carry digital data streams. The signals through the various networks and the signals on network link 120 and through communication interface 118, which carry the digital data to and from computer system 100, are exemplary forms of carrier waves transporting the information.

Computer system 100 can send messages and receive data, including program code, through the network(s), network link 120, and communication interface 118. In the Internet example, a server 130 might transmit a requested code for an application program through Internet 128, ISP 126, local network 122 and communication interface 118. In accordance with the invention, one such downloaded application provides for the determination of the calibration test patterns. The received code may be executed by processor 104 as it is received, and/or stored in storage device 110, or other non-volatile storage for later execution. In this manner, computer system 100 may obtain application code in the form of a carrier wave. generating a model of an optical imaging system which incorporates a non-linear model of the resist performance in accordance with the present invention.

Figure 20:
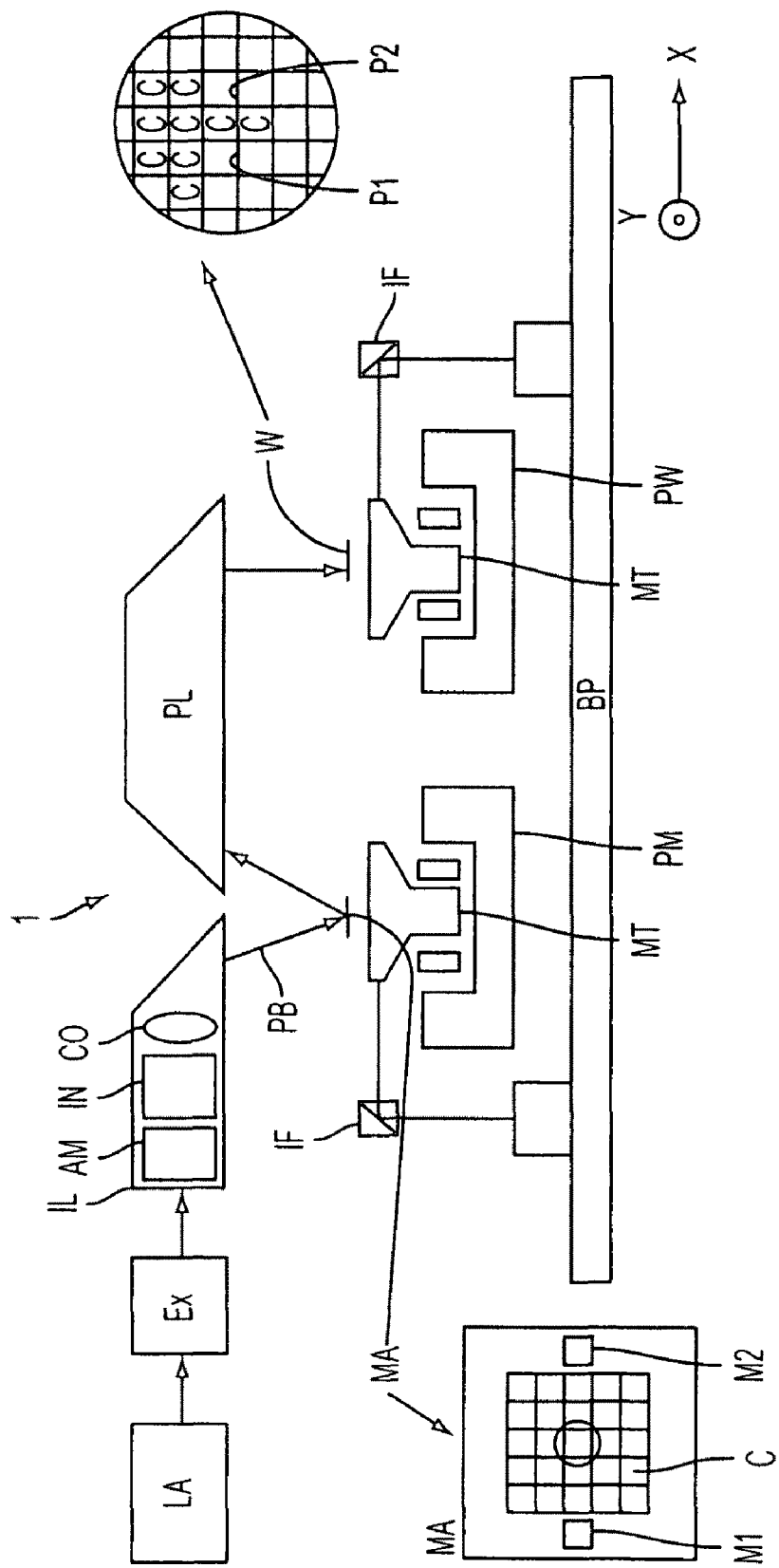
FIG. 20 schematically depicts an exemplary lithographic projection apparatus that could be the basis of the imaging model to be developed and calibrated in accordance with the process of the present invention.

FIG. 20 schematically depicts an exemplary lithographic projection apparatus 1 that could be the basis of the imaging model and CPK to be developed and calibrated in accordance with the process of the present invention. The apparatus comprises:

- a radiation system Ex, IL, for supplying a projection beam PB of radiation. In this particular case, the radiation system also comprises a radiation source LA;
- a first object table (mask table) MT provided with a mask holder for holding a mask MA (e.g., a reticle), and connected to first positioning means for accurately positioning the Mask with respect to item PL;
- a second object table (substrate table) WT provided with a substrate holder for holding a substrate W (e.g., a resist-coated silicon wafer), and connected to second positioning means for accurately positioning the substrate with respect to item PL;
- a projection system ("lens") PL (e.g., a refractive, catoptric or catadioptric optical system) for imaging an irradiated portion of the mask MA onto a target portion C. (e.g., comprising one or more dies) of the substrate W.

As depicted herein, the apparatus is of a transmissive type (i.e., has a transmissive mask). However, in general, it may also be of a reflective type, for example (with a reflective mask). Alternatively, the apparatus may employ another kind of patterning means as an alternative to the use of a mask; examples include a programmable mirror array or LCD matrix.

The source LA (e.g., a mercury lamp or excimer laser) produces a beam of radiation. This beam is fed into an illumination system (illuminator) IL, either directly or after having traversed conditioning means, such as a beam expander Ex, for example. The illuminator IL may comprise adjusting means AM for setting the outer and/or inner radial extent (commonly referred to as σ-outer and σ-inner, respectively) of the intensity distribution in the beam. In addition, it will generally comprise various other components, such as an integrator IN and a condenser CO. In this way, the beam PB impinging on the mask MA has a desired uniformity and intensity distribution in its cross-section.

It should be noted with regard to FIG. 20 that the source LA may be within the housing of the lithographic projection apparatus (as is often the case when the source LA is a mercury lamp, for example), but that it may also be remote from the lithographic projection apparatus, the radiation beam that it produces being led into the apparatus (e.g., with the aid of suitable directing mirrors); this latter scenario is often the case when the source LA is an excimer laser (e.g., based on KrF, ArF or $F_2$ lasing). The current invention encompasses at least both of these scenarios.

The beam PB subsequently intercepts the mask MA, which is held on a mask table MT. Having traversed the mask MA, the beam PB passes through the lens PL, which focuses the beam PB onto a target portion C of the substrate W. With the aid of the second positioning means (and interferometric measuring means IF), the substrate table WT can be moved accurately, e.g. so as to position different target portions C in the path of the beam PB. Similarly, the first positioning means can be used to accurately position the mask MA with respect to the path of the beam PB, e.g., after mechanical retrieval of the mask MA from a mask library, or during a scan. In general, movement of the object tables MT, WT will be realized with the aid of a long-stroke module (coarse positioning) and a short-stroke module (fine positioning), which are not explicitly depicted in FIG. 20. However, in the case of a wafer stepper (as opposed to a step-and-scan tool) the mask table MT may just be connected to a short stroke actuator, or may be fixed.

The depicted tool can be used in two different modes:

- In step mode, the mask table MT is kept essentially stationary, and an entire mask image is projected in one go (i.e., a single "flash") onto a target portion C. The substrate table WT is then shifted in the x and/or y directions so that a different target portion C can be irradiated by the beam PB;
- In scan mode, essentially the same scenario applies, except that a given target portion C is not exposed in a single "flash". Instead, the mask table MT is movable in a given direction (the so-called "scan direction", e.g., the y direction) with a speed v, so that the projection beam PB is caused to scan over a mask image; concurrently, the substrate table WT is simultaneously moved in the same or opposite direction at a speed $V=Mv$, in which M is the magnification of the lens PL (typically, $M=1/4$ or $1/5$). In this manner, a relatively large target portion C can be exposed, without having to compromise on resolution.

The concepts disclosed herein may simulate or mathematically model any generic imaging system for imaging sub wavelength features, and may be especially useful with emerging imaging technologies capable of producing wavelengths of an increasingly smaller size. Emerging technologies already in use include EUV (extreme ultra violet) lithography that is capable of producing a 193 nm wavelength with the use of a ArF laser, and even a 157 nm wavelength with the use of a Fluorine laser. Moreover, EUV lithography is capable of producing wavelengths within a range of 20-5 nm by using a synchrotron or by hitting a material (either solid or a plasma) with high energy electrons in order to produce photons within this range. Because most materials are absorptive within this range, illumination may be produced by reflective mirrors with a multi-stack of Molybdenum and Silicon. The multi-stack mirror has a 40 layer pairs of Molybdenum and Silicon where the thickness of each layer is a quarter wavelength. Even smaller wavelengths may be produced with X-ray lithography. Typically, a synchrotron is used to produce an X-ray wavelength. Since most material is absorptive at x-ray wavelengths, a thin piece of absorbing material defines where features would print (positive resist) or not print (negative resist).

While the apparatus disclosed herein may be used for imaging on a substrate such as a silicon wafer, it shall be understood that the disclosed concepts may be used with any type of lithographic imaging systems, e.g., those used for imaging on substrates other than silicon wafers.

Although the present invention has been described and illustrated in detail, it is to be clearly understood that the same is by way of illustration and example only and is not to be taken by way of limitation, the scope of the present invention being limited only by the terms of the appended claims.

What is claimed is:

1. A computer-implemented method of generating a model for simulating imaging performance of an optical imaging system; said method comprising the steps of:
   defining said optical imaging system and a process to be utilized by said optical imaging system;
   defining a first model representing the imaging performance of said optical imaging system and said process, said first model generating values corresponding to a developed image dimension and a latent image slope,
   defining a second model for estimating a line width roughness of a feature to be imaged, said second model utilizing said latent image slope values generated by said first model to estimate said line width roughness,
   wherein at least the steps of defining the first and second models are implemented by a computer,
   calibrating said first model using first experimental imaging data obtained from said optical imaging system and said process;
   obtaining simulated latent image slope values from simulated imaging data generated by said calibrated first model;
   obtaining second experimental imaging data associated with said first experimental imaging data from said optical imaging system and said process, said second experimental imaging data including line width roughness data; and
   calibrating said second model by selecting values for parameters contained in said second model such that said second model generates line width roughness estimates from the simulated latent image slope values, which correspond to the line width roughness data of the second experimental data within a predefined error tolerance.

2. The method of generating a model for simulating the imaging performance of an optical imaging system according to claim 1, where said second model is defined as: $LWR = a \cdot (LI_{slope})^b + c$, where a, b and c correspond to said parameters, and wherein LWR is line width roughness and $LI_{slope}$ is latent image slope.

3. The method of generating a model for simulating the imaging performance of an optical imaging system according to claim 1, wherein said latent image slope is determined at the edge of said feature.

4. A computer-implemented method of simulating imaging performance of an optical imaging system; said method comprising the steps of:
   defining said optical imaging system and a process to be utilized by said optical imaging system;
   defining a first model representing the imaging performance of said optical imaging system and said process, said first model generating values corresponding to a developed image dimension and a latent image slope,
   defining a second model for estimating a line width roughness of a feature to be imaged, said second model utilizing said latent image slope values generated by said first model to estimate said line width roughness,
   wherein at least the steps of defining the first and second models are implemented by a computer,
   calibrating said first model using first experimental imaging data obtained from said optical imaging system and said process;
   obtaining simulated latent image slope values from simulated imaging data generated by said calibrated first model;
   obtaining second experimental imaging data associated with said first experimental imaging data from said optical imaging system and said process, said second experimental imaging data including line width roughness data; and
   calibrating said second model by selecting values for parameters contained in said second model such that said second model generates line width roughness estimates from the simulated latent image slope values, which correspond to the line width roughness data of the second experimental data within a predefined error tolerance.

5. The method of simulating the imaging performance of an optical imaging system according to claim 4, where said second model is defined as: $LWR = a \cdot (LI_{slope})^b + c$, where a, b and c correspond to said parameters, and wherein LWR is line width roughness and $LI_{slope}$ is latent image slope.

6. The method of simulating the imaging performance of an optical imaging system according to claim 4, wherein said latent image slope is determined at the edge of said feature.

7. A non-transitory computer readable storage medium bearing a computer program for generating a model for simulating imaging performance of an optical imaging system, the computer program, when executed, causing a computer to perform the steps of:
   defining said optical imaging system and a process to be utilized by said optical imaging system;
   defining a first model representing the imaging performance of said optical imaging system and said process, said first model generating values corresponding to a developed image dimension and a latent image slope,
   defining a second model for estimating a line width roughness of a feature to be imaged, said second model utilizing said latent image slope values generated by said first model to estimate said line width roughness,
   wherein at least the steps of defining the first and second models are implemented by a computer,
   calibrating said first model using first experimental imaging data obtained from said optical imaging system and said process;
   obtaining simulated latent image slope values from simulated imaging data generated by said calibrated first model;
   obtaining second experimental imaging data associated with said first experimental imaging data from said optical imaging system and said process, said second experimental imaging data including line width roughness data; and
   calibrating said second model by selecting values for parameters contained in said second model such that said second model generates line width roughness estimates from the simulated latent image slope values, which correspond to the line width roughness data of the second experimental data within a predefined error tolerance.

8. The non-transitory computer readable storage medium according to claim 7, where said second model is defined as: $LWR = a \cdot (LI_{slope})^b + c$, where a, b and c correspond to said parameters, and wherein LWR is line width roughness and $LI_{slope}$ is latent image slope.

9. The non-transitory computer readable storage medium according to claim 7, wherein said latent image slope is determined at the edge of said feature.

* * * * *